US012453063B2

(12) United States Patent
Fan et al.

(10) Patent No.: US 12,453,063 B2
(45) Date of Patent: Oct. 21, 2025

(54) POWER-MODULE-HEAT-DISSIPATION ASSEMBLY

(71) Applicant: Delta Electronics, Inc., Taoyuan (TW)

(72) Inventors: Kang-Yu Fan, Taoyuan (TW); Jhih-Yang Li, Taoyuan (TW); Hsing-Yu Wu, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 228 days.

(21) Appl. No.: 18/207,600

(22) Filed: Jun. 8, 2023

(65) Prior Publication Data

US 2024/0341051 A1  Oct. 10, 2024

(30) Foreign Application Priority Data

Apr. 6, 2023  (CN) .......................... 202310356809.7

(51) Int. Cl.
*H05K 7/20* (2006.01)

(52) U.S. Cl.
CPC ..... *H05K 7/20927* (2013.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 5,495,889 A * | 3/1996 | Dubelloy | ............... | H01L 25/117 |
| | | | | 361/689 |
| 5,539,617 A * | 7/1996 | Bochtler | ............... | H01L 23/473 |
| | | | | 257/E23.098 |
| 7,835,151 B2 * | 11/2010 | Olesen | .................. | H01L 23/473 |
| | | | | 361/689 |
| 8,530,281 B2 * | 9/2013 | Noritake | ............. | H01L 23/3135 |
| | | | | 438/122 |
| 11,134,590 B2 * | 9/2021 | Wang | .................. | H05K 7/20872 |
| 11,324,148 B2 * | 5/2022 | Hampo | ................ | H05K 1/0209 |

(Continued)

FOREIGN PATENT DOCUMENTS

| | | |
|---|---|---|
| CN | 109302083 A | 2/2019 |
| CN | 214956873 U | 11/2021 |

(Continued)

*Primary Examiner* — Courtney L Smith
(74) *Attorney, Agent, or Firm* — KIRTON McCONKIE; Evan R. Witt

(57) ABSTRACT

A power-module-heat-dissipation assembly is disclosed and includes plural first power modules, plural second power modules, a cooling-flow-channel inlet, a cooling-flow-channel outlet, a first housing base and a second housing base. The first housing base including a first flow channel and a first heat dissipation surface, and the second housing base including a second flow channel and a second heat dissipation surface are assembled to form a housing extended along a first direction. The first heat dissipation surface and the second heat dissipation surface are disposed on two opposite sides of the housing. The first and second power modules are arranged along the first direction and disposed on the first and second heat dissipation surfaces. The first and second flow channel are in fluid communication between the coolant flow-channel inlet and the cooling-flow-channel outlet, so as to dissipate the heat generated from the first and second power modules quickly and evenly.

17 Claims, 20 Drawing Sheets

(56) References Cited

U.S. PATENT DOCUMENTS

| | | | | |
|---|---|---|---|---|
| 11,355,284 | B2* | 6/2022 | Kienle | H05K 7/20236 |
| 12,238,904 | B2* | 2/2025 | Kosteva | H05K 7/14324 |
| 2012/0001341 | A1* | 1/2012 | Ide | H01L 25/117 |
| | | | | 257/773 |
| 2017/0055378 | A1* | 2/2017 | Zhou | H05K 7/20927 |
| 2019/0014686 | A1 | 1/2019 | Nakamura et al. | |
| 2019/0343019 | A1 | 11/2019 | Todorovic et al. | |
| 2022/0015271 | A1* | 1/2022 | De Sousa | H01L 23/473 |
| 2022/0142013 | A1* | 5/2022 | Zhou | F28F 3/12 |
| | | | | 361/702 |
| 2022/0149453 | A1 | 5/2022 | Zhang et al. | |

FOREIGN PATENT DOCUMENTS

| | | |
|---|---|---|
| CN | 216122229 U | 3/2022 |
| CN | 114786440 A | 7/2022 |
| TW | I666868 B | 7/2019 |

\* cited by examiner

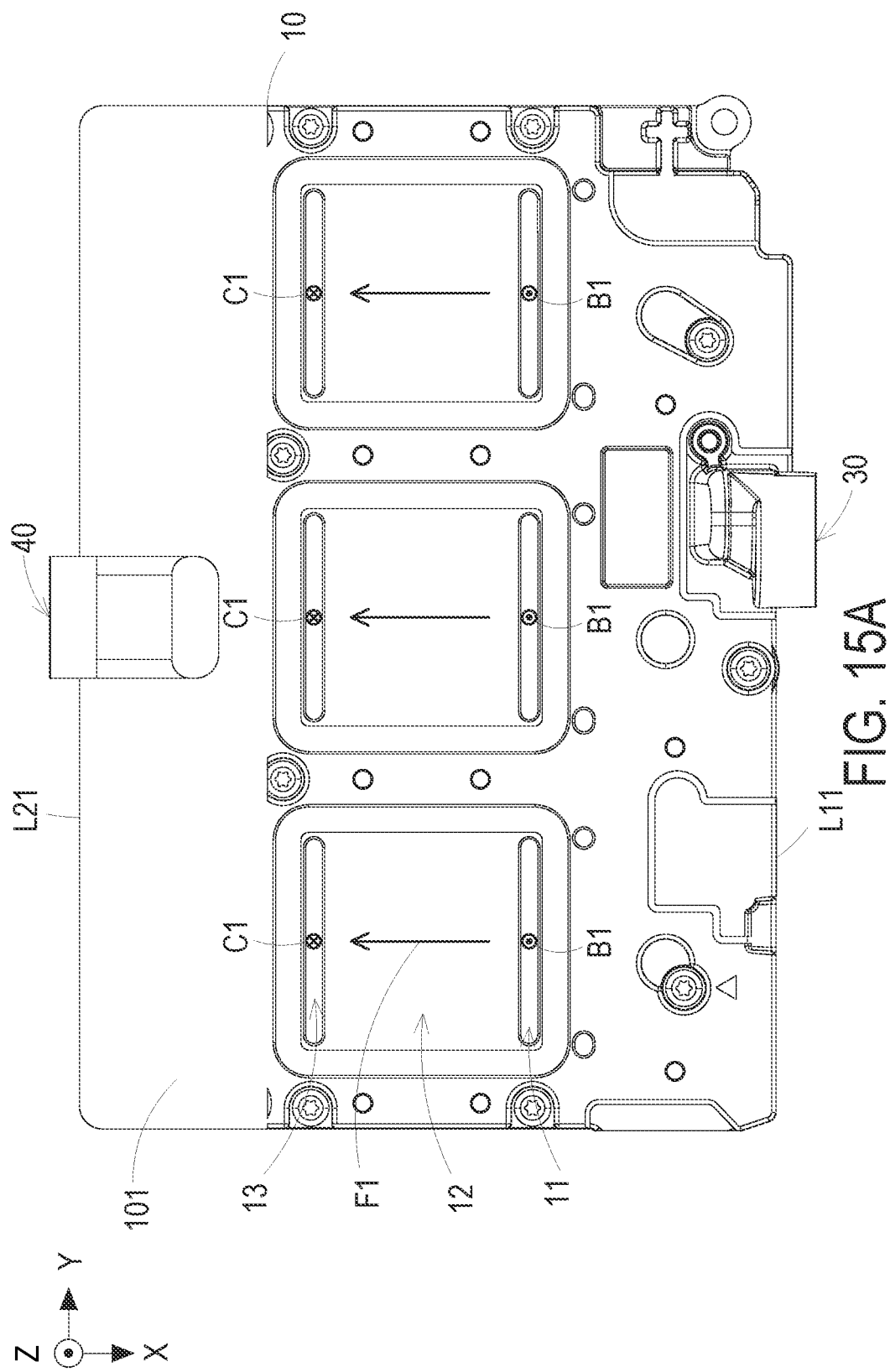

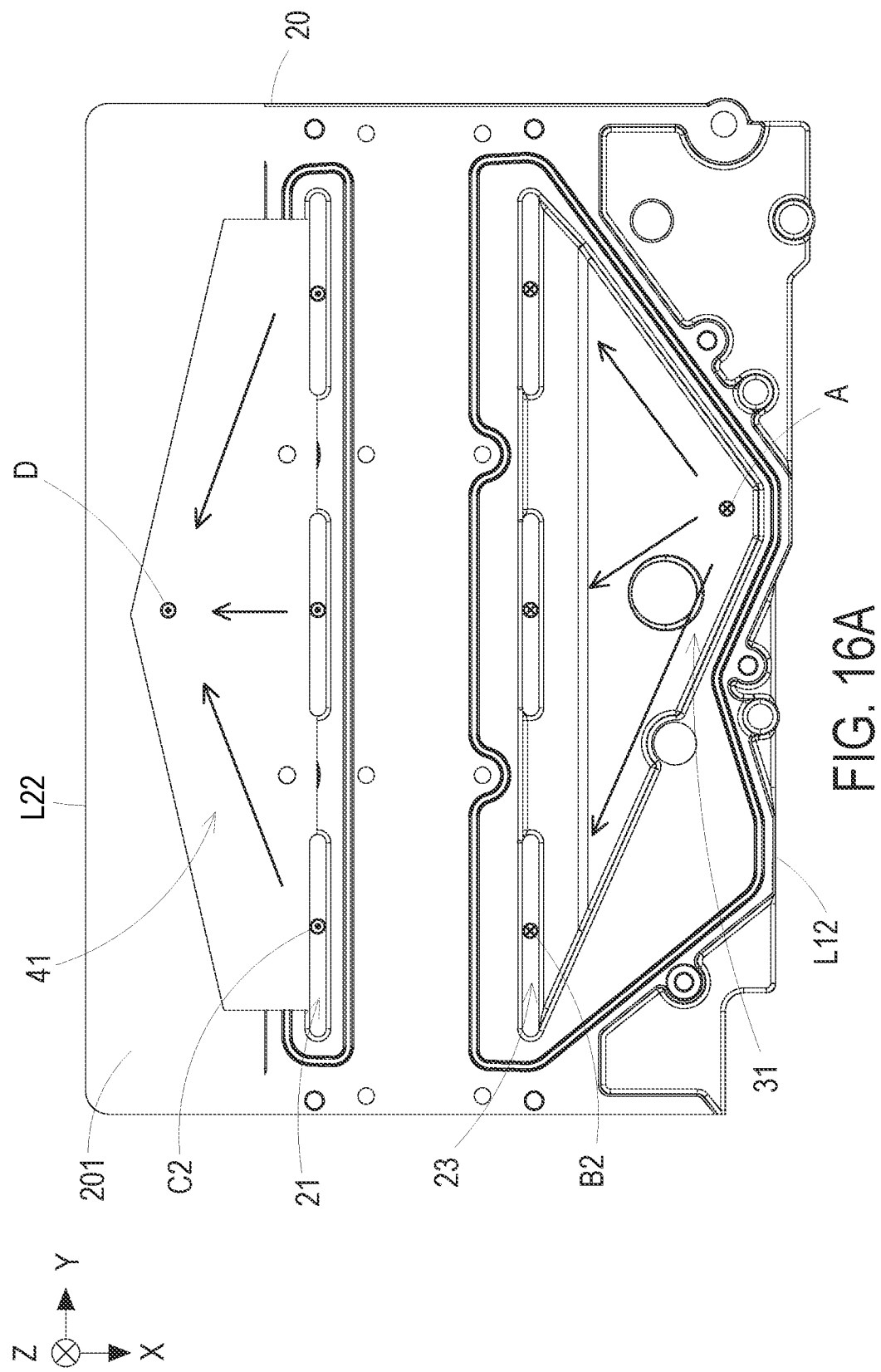

POWER-MODULE-HEAT-DISSIPATION ASSEMBLY

CROSS-REFERENCE TO RELATED APPLICATION

This application claims priority to China Patent Application No. 202310356809.7, filed on Apr. 6, 2023. The entire contents of the above-mentioned patent application are incorporated herein by reference for all purposes.

FIELD OF THE INVENTION

The present disclosure relates to a heat dissipation assembly, and more particularly to a power-module-heat-dissipation assembly suitable for a stacked inverter and capable of providing two separated flow channels for dual elongated power modules stacked on the upper side and the lower side, respectively, so as to improve the heat dissipation efficiency effectively.

BACKGROUND OF THE INVENTION

Generally, an electronic device is often combined with a heat dissipation assembly to dissipate the internal heat. For example, a high-efficiency power module used in the inverter is often accompanied with a lot of heat generated therefrom, and must be combined with a water-cooled heat dissipation assembly to achieve an effective effect of heat dissipation.

A traction inverter for the vehicle motor usually includes three high-power modules arranged in a line to form an elongated structure, and the water-cooled heat dissipation assembly combined therewith is designed as a single-sided cooling channel. The heat dissipation assembly has one side thermally coupled to the three high-power modules, and another side provided for the outlet and the inlet of the cooling channel. However, when the inverter is designed as a stacked inverter, the design of the conventional heat dissipation assembly with the single-sided cooling channel will take up more space, and it is not conducive to the overall space configuration of the stacked inverter. How to solve the problem of combining the stacked inverter with of the heat dissipation assembly to achieve an effective heat dissipation has always been a major subject in the art.

Therefore, there is a need of providing a power-module-heat-dissipation assembly suitable for a stacked inverter and capable of providing two separated flow channels for dual elongated power modules stacked on the upper side and the lower side, respectively, so as to improve the heat dissipation efficiency effectively, and obviate the drawbacks encountered by the prior arts.

SUMMARY OF THE INVENTION

An object of the present disclosure is to provide a power-module-heat-dissipation assembly suitable for a stacked inverter and capable of providing two separated flow channels for dual elongated power modules stacked on the upper side and the lower side, respectively, so as to improve the heat dissipation efficiency effectively.

Another object of the present disclosure is to provide a power-module-heat-dissipation assembly. With coolant flow channels shared and formed between the first power module and the second power module stacked up and down, the coolant flow channels separated in different layers are thermally coupled to two opposite surfaces, respectively, and in fluid communication with each other adjacent to the elongated lateral sides, so that it facilitates the power-module-heat-dissipation assembly to provide an effective efficiency of heat dissipation for the elongated power modules stacked on the upper side and the lower side. The elongated housing includes a first housing base and a second housing base stacked with each other to form a first cooling region and a second cooling region stacked up and down, so as to reduce the unfolded plane. The first flow channel in the first housing base and the second flow channel in the second housing base are located separately and in fluid communication with each other. In order to achieve the purposes of reducing the length of the flow channels and improving the heat dissipation performance, the flow directions of the first flow channel and the second flow channel are designed not to extend along the elongated direction, but a design with shorten path is adopted. Furthermore, the first flow channel and the second flow channel are stacked up and down to reduce the unfolded plane, and the first flow channel and the second flow channel are in fluid communication with each other between two opposite elongated lateral sides of the elongated housing. In this way, the coolant inlet direction is perpendicular to the arrangement direction of the first power modules, so that the adjacent ones of the first power modules have the similar condition for heat dissipation. Furthermore, the coolant outlet direction is perpendicular to the arrangement direction of the second power modules, so that the adjacent ones of the second power module have the similar condition for heat dissipation. It facilitates each power module to dissipate the heat generated therefrom quickly and evenly, so as to improve the overall efficiency of heat dissipation effectively.

In accordance with an aspect of the present disclosure, a power-module-heat-dissipation assembly is provided and includes a plurality of first power modules, a plurality of second power modules, a coolant flow-channel inlet, a coolant flow-channel outlet, a first housing base and a second housing base. The plurality of first power modules are arranged along a first direction. The plurality of second power modules are arranged along the first direction. The first housing base includes a first flow channel and a first heat dissipation surface. The second housing base includes a second flow channel and a second heat dissipation surface. The first housing base and the second housing base are matched and assembled with each other to form a housing extended along the first direction and having a first elongated lateral side and a second elongated lateral side opposite to each other. The first heat dissipation surface and the second heat dissipation surface are disposed on two opposite sides of the housing, respectively. The plurality of first power modules are disposed on the first heat dissipation surface along the first direction, and the plurality of second power modules are disposed on the second heat dissipation surface along the first direction. The first flow channel is a hollow structure of the first housing base and includes a first flow-channel front port, a first chamber and a first flow-channel rear port, the first chamber is in fluid communication with the first flow-channel front port and the first flow-channel rear port, the first chamber is corresponding to an outer surface of the first housing base to form the first heat dissipation surface, the second flow channel is a hollow structure of the second housing base and includes a second flow-channel front port, a second chamber and a second flow-channel rear port, the second chamber is in fluid communication with the second flow-channel front port and the second flow-channel rear port, and the second chamber is corresponding to an outer surface of the second housing base to form the second heat dissipation surface. The coolant flow-channel inlet is in fluid communication with the first flow-channel front port, the first flow-channel rear port is in fluid communication with the second flow-channel rear port, and the second flow-channel front port is in fluid communication with the coolant flow-channel outlet.

In accordance with another aspect of the present disclosure, a power-module-heat-dissipation assembly is provided and includes a plurality of first power modules, a plurality of second power modules, a coolant flow-channel inlet, a coolant flow-channel outlet, a first housing base and a second housing base. The plurality of first power modules are arranged along a first direction. The plurality of second power modules are arranged along the first direction. The first housing base includes a first flow channel and a first heat dissipation surface. The second housing base includes a second flow channel and a second heat dissipation surface. The first housing base and the second housing base are matched and assembled with each other to form a housing extended along the first direction and having a first elongated lateral side and a second elongated lateral side opposite to each other. The first heat dissipation surface and the second heat dissipation surface are disposed on two opposite sides of the housing, respectively. The plurality of first power modules are disposed on the first heat dissipation surface along the first direction, and the plurality of second power modules are disposed on the second heat dissipation surface along the first direction. The first flow channel is a hollow structure of the first housing base and includes a first flow-channel front port, a first chamber and a first flow-channel rear port, the first chamber is in fluid communication with the first flow-channel front port and the first flow-channel rear port, the first chamber is corresponding to an outer surface of the first housing base to form the first heat dissipation surface, the second flow channel is a hollow structure of the second housing base and includes a second flow-channel front port, a second chamber and a second flow-channel rear port, the second chamber is in fluid communication with the second flow-channel front port and the second flow-channel rear port, and the second chamber is corresponding to an outer surface of the second housing base to form the second heat dissipation surface. The coolant flow-channel inlet is in fluid communication with the first flow-channel front port and the second flow-channel front port, and the first flow-channel rear port and the second flow-channel rear port are in fluid communication with the coolant flow-channel outlet.

BRIEF DESCRIPTION OF THE DRAWINGS

The above contents of the present disclosure will become more readily apparent to those ordinarily skilled in the art after reviewing the following detailed description and accompanying drawings, in which:

FIG. 15A is a bottom view illustrating the first housing base of the power-module-heat-dissipation assembly according to the second embodiment of the present disclosure and taken from the upper perspective;

FIG. 16A is a bottom view illustrating the second housing base of the power-module-heat-dissipation assembly according to the first embodiment of the present disclosure and taken from the upper perspective.

DETAILED DESCRIPTION OF THE PREFERRED EMBODIMENT

Figure 1:
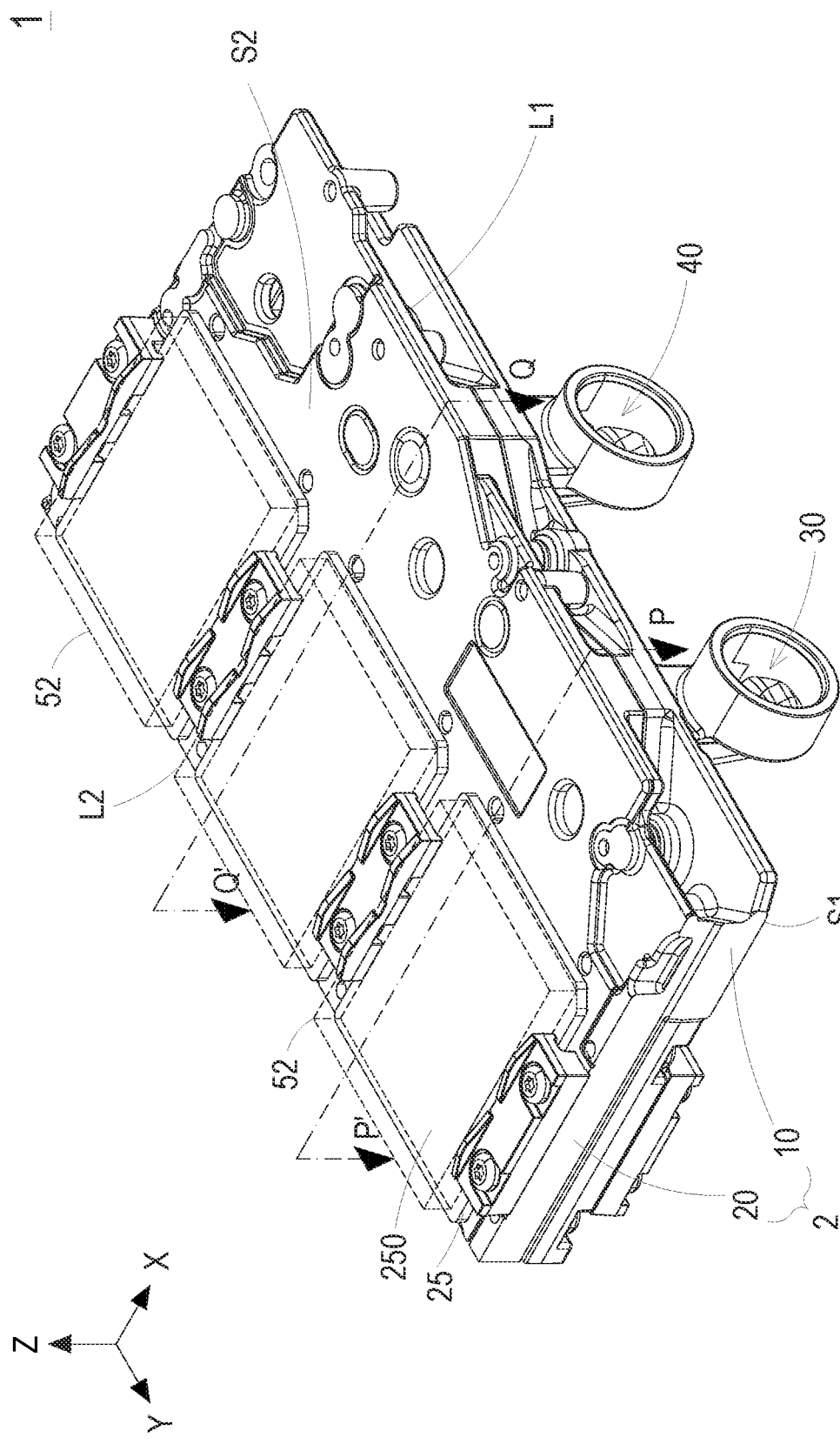
FIG. 1 is a perspective structural view illustrating a power-module-heat-dissipation assembly according to a first embodiment of the present disclosure and taken from the upper perspective.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "inwardly," "outwardly," "upper," "lower" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

Figure 2:
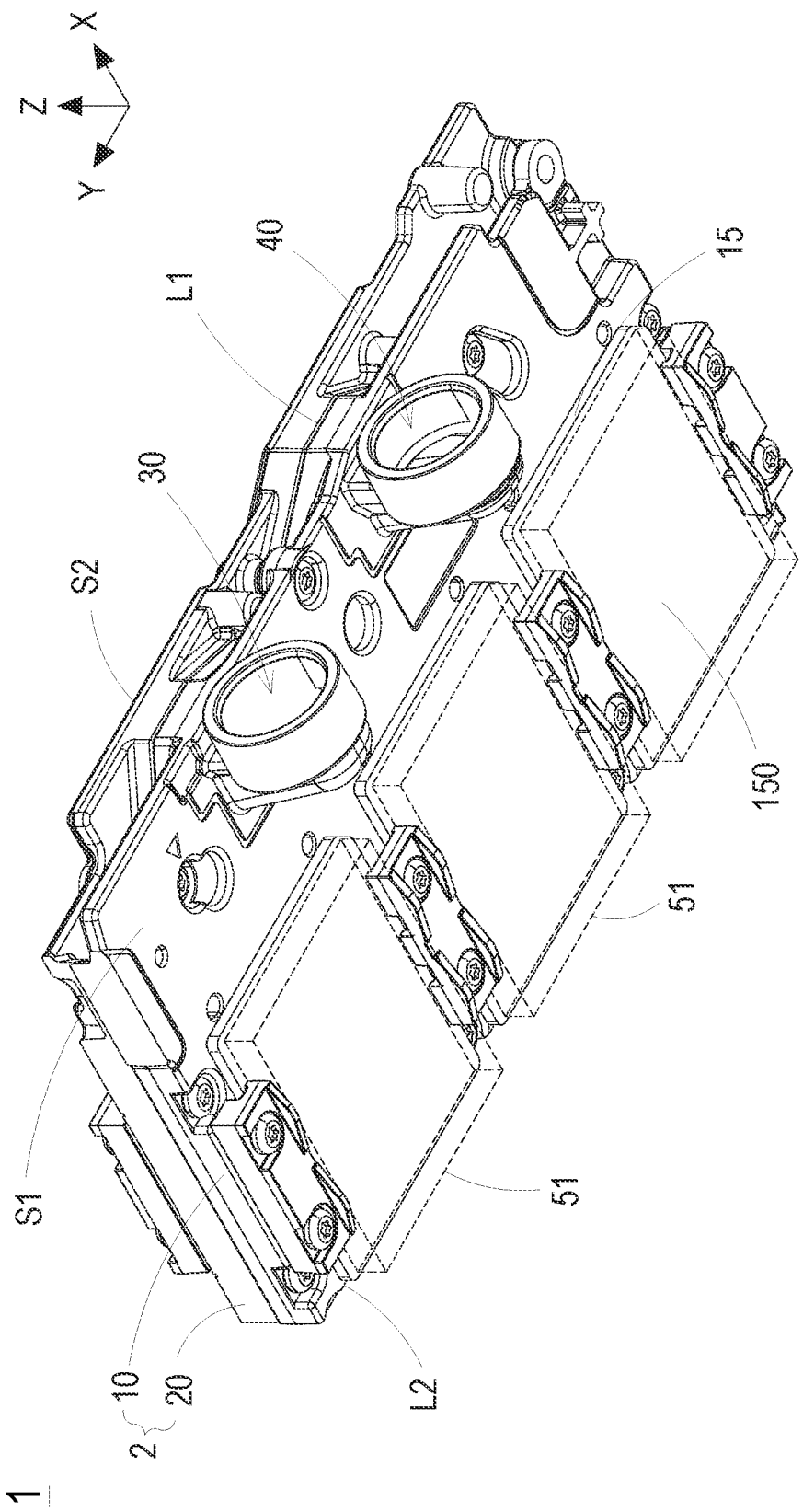
FIG. 2 is a perspective structural view illustrating the power-module-heat-dissipation assembly according to the first embodiment of the present disclosure and taken from the lower perspective.
Figure 3:
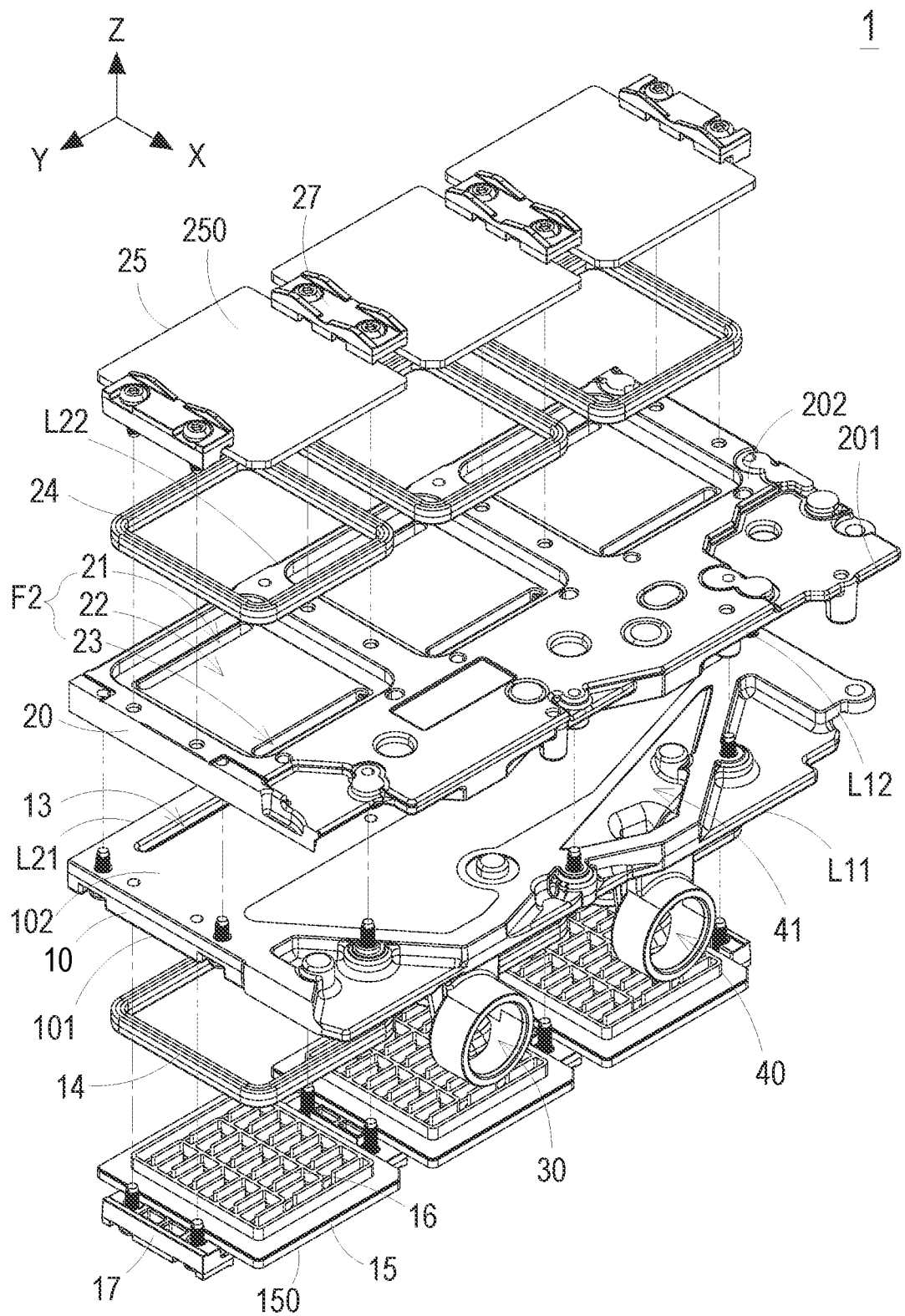
FIG. 3 is an exploded view illustrating the power-module-heat-dissipation assembly according to the first embodiment of the present disclosure and taken from the upper perspective.
Figure 4:
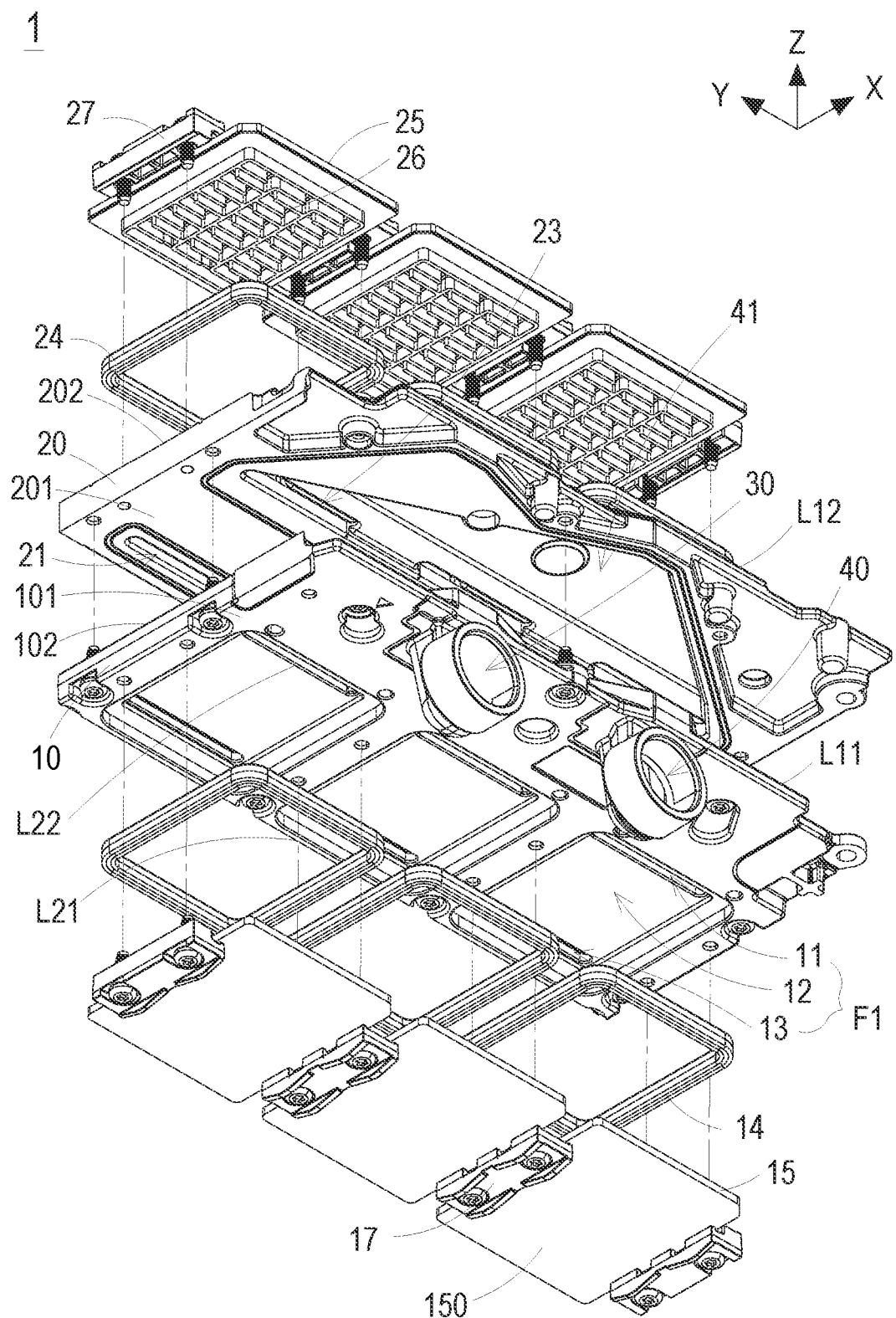
FIG. 4 is an exploded view illustrating the power-module-heat-dissipation assembly according to the first embodiment of the present disclosure and taken from the lower perspective.
Figure 5:
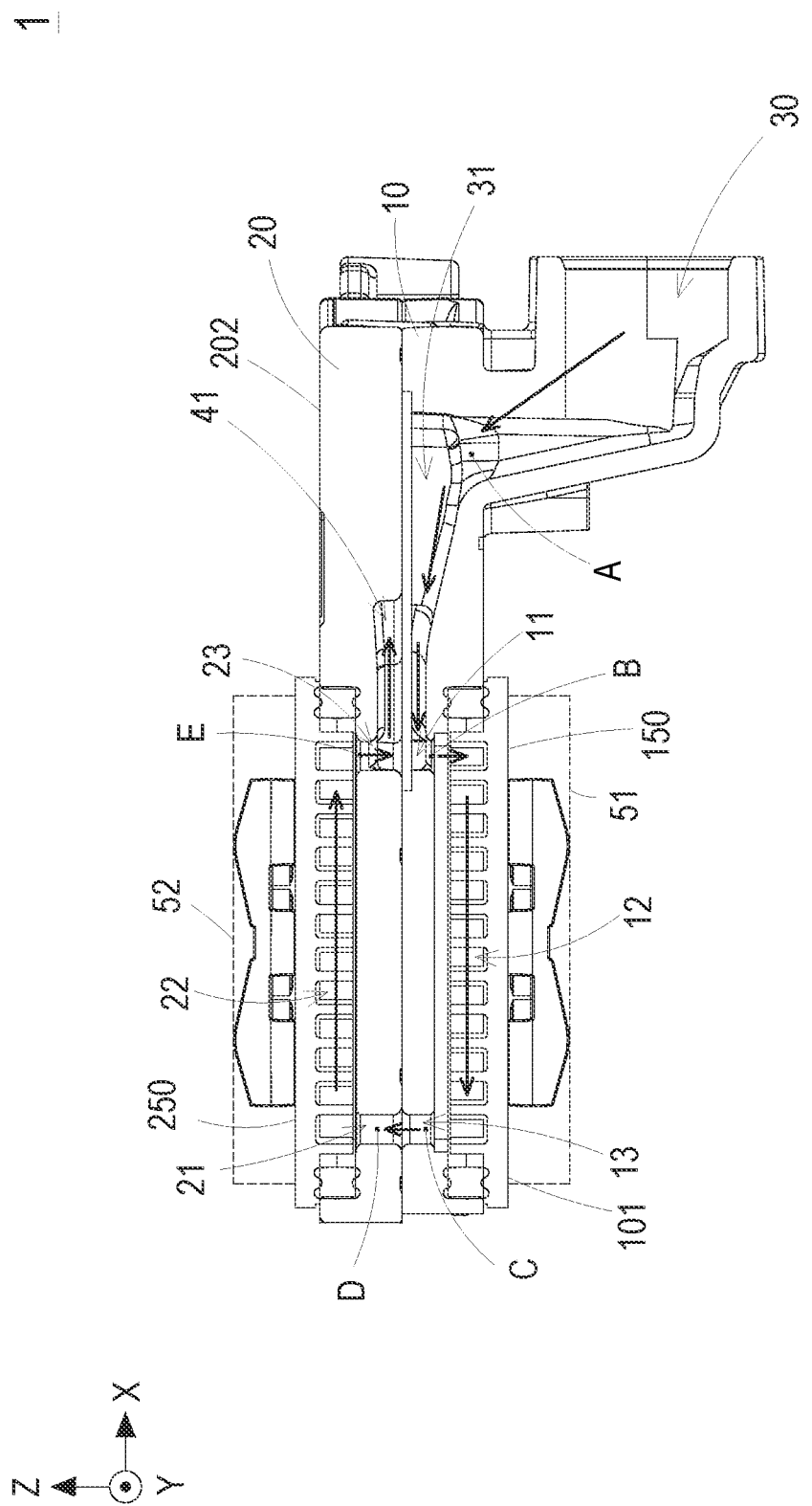
FIG. 5 is a cross-section view of the power-module-heat-dissipation assembly in FIG. 1 taken along the line PP'.
Figure 6:
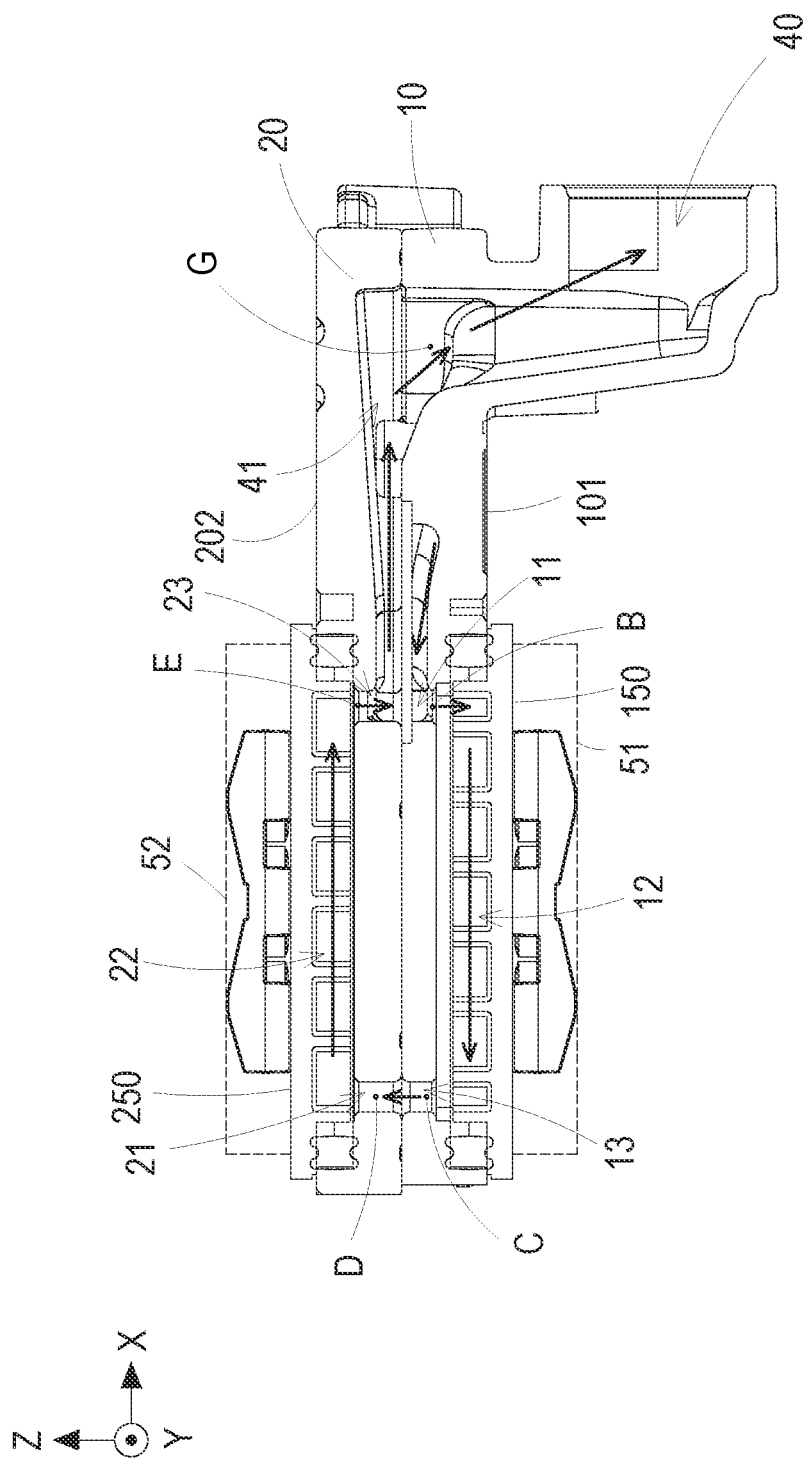
FIG. 6 is a cross-section view of the power-module-heat-dissipation assembly in FIG. 1 taken along the line QQ'.

Please refer to FIGS. 1 to 6. In the embodiment, the present disclosure provides a power-module-heat-dissipation assembly 1 includes a plural of first power modules 51, a plurality of second power modules 52, a coolant flow-channel inlet 30, a coolant flow-channel outlet 40, a first housing base 10 and a second housing base 20. The plurality of first power modules 51 are arranged along a first direction, such as the Y axial direction. The plurality of second power modules 52 are arranged along the first direction, such as the Y axial direction. The first housing base 10 includes a first flow channel F1 and a first heat dissipation surface 150. The second housing base 20 includes a second flow channel F2 and a second heat dissipation surface 250. The first housing base 10 and the second housing base 20 are matched and assembled with each other to form an elongated housing 2, which is extended along the first direction, such as the Y axial direction and has a first elongated lateral side L1 and a second elongated lateral side L2 opposite to each other. In the embodiment, when the first housing base 10 and the second housing base 20 are matched and assembled to form the elongated housing 2, the upper surface 102 of the first housing base 10 is attached to the lower surface 201 of the second housing base 20, the first elongated lateral side L11 of the first housing base 10 is corresponding to the first elongated lateral side L12 of the second housing base 20, and the second elongated lateral side L21 of the first housing base 10 is corresponding to the second elongated lateral side L22. In that, the lower surface 101 of the first housing base 10 is served as the lower surface S1 of the elongated housing 2, the upper surface 202 of the second housing base 20 is served as the upper surface S2 of the elongated housing 2, the first elongated lateral sides L11, L12 are served as the first elongated lateral side L1 of the elongated housing 2, and the second elongated lateral sides L21, L22 are served as the second elongated lateral side L2 of the elongated housing 2. Furthermore, the first heat dissipation surface 150 and the second heat dissipation surface 250 are respectively disposed on the lower surface S1 and the upper surface S2, which are two opposite sides of the elongated housing 2. The plurality of first power modules 51 are disposed on the first heat dissipation surface 150 along the first direction, and the plurality of second power modules 52 are disposed on the second heat dissipation surface 250 along the first direction. The first flow channel F1 is a hollow structure of the first housing base 10 and includes a first flow-channel front port 11, a first chamber 12 and a first flow-channel rear port 13. The first chamber 12 is in fluid communication with the first flow-channel front port 11 and the first flow-channel rear port 13. The first chamber 12 is corresponding to an outer surface (i.e., the lower surface 101) of the first housing base 10 to form the first heat dissipation surface 150. The second flow channel F2 is a hollow structure of the second housing base 20 and includes a second flow-channel rear port 21, a second chamber 22 and a second flow-channel front port 23. The second chamber 22 is in fluid communication with the second flow-channel rear port 21 and the second flow-channel front port 23. The second chamber 22 is corresponding to an outer surface (i.e., the upper surface 202) of the second housing base 20 to form the second heat dissipation surface 250. The coolant flow-channel inlet 30 is in fluid communication with the first flow-channel front port 11. The first flow-channel rear port 13 is in fluid communication with the second flow-channel rear port 21. The second flow-channel front port 23 is in fluid communication with the coolant flow-channel outlet 40. In this way, the first flow channel F1 and the second flow channel F2 are stacked between the first heat dissipation surface 150 and the second heat dissipation surface 250 along the Z axial direction, and in fluid communicate with each other.

In the embodiment, the first flow-channel front port 11 and the second flow-channel front port 23 are disposed adjacent to the first elongated lateral side L1, and the first flow-channel rear port 13 and the second flow-channel rear port 21 are disposed adjacent to the second elongated lateral side L2. The first flow channel F1 and the second flow channel F2 are connected with each other in series and in fluid communication between the first elongate lateral side L1 and the second elongated lateral side L2. Moreover, the flow directions of the first flow channel F1 and the second flow channel F2 are approximately parallel to the X axial direction, but not parallel to the first direction (i.e., the Y axial direction).

On the other hand, in an embodiment, the plurality of first power modules 51 and the plurality of second power modules 52 oppositely stacked on the lower surface S1 and the upper surface S2 can be configured for example to form two sets of multi-phase inverters, and output two sets of motor driving currents. In another embodiment, the plurality of first power modules 51 are paired with the plurality of second power modules 52 to form a parallel multi-phase inverter. The plurality of first power modules 51 and the plurality of second power modules 52 are correspondingly disposed up and down on the housing 2, and configured to output in parallel. Preferably but not exclusively, the plurality of first power modules 51 and the plurality of second power modules 52 are connected in parallel to output a set of motor drive currents. Certainly, the numbers and the relative arrangements of the plurality of first power modules 41 and the plurality of second power modules 52 are adjustable according to the practical requirements. Notably, the power-module-heat-dissipation assembly of the present disclosure is further applied to a stacked inverter, so as to perform the heat dissipation for the plurality of first power modules 51 and the plurality of second power modules 52. In other words, it allows to stack the plurality of power modules of the stacked inverter on the lower surface S1 and the upper surface S2 of the power-module-heat-dissipation assembly 1, and the power modules are divided into the first power module 51 and the second power module 52. The first power modules 51 are spatially corresponding to and thermal coupled to the plurality of first heat dissipation surfaces 150 on the lower surface S1, respectively. Moreover, the second power modules 52 are spatially corresponding to and thermal coupled to the plurality of second heat dissipation surfaces 250 on the upper surface S2, respectively. In the embodiment, the plurality of first heat dissipation surfaces 150 and the plurality of second heat dissipation surfaces 250 are arranged and disposed along the first direction (i.e., the Y axial direction).

In other words, the numbers of the first heat dissipation surfaces 150 and the second heat dissipation surfaces 250 are adjustable according to the number of power modules of the stacked inverter. When the number of power modules required to be combined in the stacked inverter is increased, the numbers of the first heat dissipation surfaces 150 and the second heat dissipation surfaces 250 are increased and arranged along the first direction (i.e., the Y axial direction. In the embodiment, the numbers of the first heat dissipation surface 150 and the number of the second heat dissipation surface 250 are taken 3 as an example, but the present disclosure is not limited thereto. In an embodiment, the first heat dissipation surfaces 150 or the second heat dissipation surfaces 250 can also be integrally formed into a single elongated structure. The present disclosure is not limited thereto. In this way, the coolant inlet direction is perpendicular to the arrangement direction (i.e., the Y axial direction) of the first power modules 51, so that the adjacent ones of the first power modules 51 have the similar condition for heat dissipation conditions. Furthermore, the coolant outlet direction is perpendicular to the arrangement direction (i.e., the Y axial direction) of the second power modules, so that the adjacent ones of the second power modules 52 have the similar condition for heat dissipation. It facilitates each power module to dissipate the heat generated therefrom quickly and evenly, so as to improve the overall efficiency of heat dissipation effectively.

In the embodiment, the coolant flow-channel inlet 30 and the coolant flow-channel outlet 40 of the power-module-heat-dissipation assembly 1 are disposed adjacent to the first elongated lateral side L1, and the first flow channel F1 and the second flow channel F2 are in fluid communication between the coolant flow-channel inlet 30 and the coolant flow-channel outlet 40. In the embodiment, the coolant flow-channel inlet 30 and the coolant flow-channel 40 face the same direction (i.e., the X axial direction), and are disposed adjacent to the first elongated lateral side L1. In the embodiment, the first flow channel F1 of the first housing base 10 passes through the first chamber 12, and is in fluid communication between the first flow-channel front port 11 and the first flow-channel rear port 13. The second flow channel F2 of the second housing base 20 passes through the second chamber 22, and is in fluid communication between the second flow-channel rear port 21 and the second flow-channel front port 23. In the embodiment, the first flow channel F1 and the second flow channel F2 are connected with each other in series. When the first housing base 10 and the second housing base 20 are matched and assembled with each other to form the elongated housing 2, the first flow-channel rear port 13 of the first housing base 10 and the second flow-channel rear port 23 are connected and in fluid communication with each other. The coolant flow-channel inlet 30 and the coolant flow-channel outlet 40 are disposed adjacent to the first elongated lateral side L1, and the first flow-channel rear port 13 and the second flow-channel rear port 21 are both disposed adjacent to the second elongated side L2. In this way, the first flow channel F1 and the second flow channel F2 are connected in series and in fluid communication between the coolant flow-channel inlet 30 and the coolant flow-channel outlet 40, and the first flow channel F1 and the second flow channel F2 can be laterally connected between the first elongated lateral side L1 and the second elongated lateral side L2, which are two opposite elongated lateral sides of the elongated housing 2, so as to achieve the purposes of reducing the length of the flow channel and improving the heat dissipation performance. When the power-module-heat-dissipation assembly 1 is applied to the stacked inverter, it facilitates each one of the first power modules 51 thermally coupled to the first heat dissipation surfaces 150 and the second power modules 52 thermal coupled to the second heat dissipation surfaces 250 to dissipate the heat generated therefrom quickly and evenly, so as to improve the overall efficiency of heat dissipation effectively.

In the embodiment, the first housing base 10 further includes a first buffer chamber 31. The first buffer chamber 31 is formed in the first housing base 10 and in fluid communication between the coolant flow-channel inlet 30 and the first flow-channel front port 11 of the first flow channel F1. The first flow-channel front port 11 is extended along the first elongated lateral side L1, and the coolant flow-channel inlet 30 is expanded in communication range through the first buffer chamber 31 and in fluid communication with the first flow-channel front port 11. In case of that the first housing base 10 includes a plurality of first flow channels F1, each one of the first chambers 12 in the first flow channels F1 and each one of the first heat dissipation surfaces 150 are corresponding to one of the first power modules 51, and the plurality of first flow-channel front ports 11 of the first flow channel F1 are connected in parallel through the first buffer chamber 31, and communicate to the coolant flow-channel inlet 30. Since the plurality of first flow-channel front ports 11 are disposed and arranged along the first elongated lateral side L1, it allows the coolant flow-channel inlet 30 to expand in communication range through the first buffer chamber 31 and be in fluid communication with the plurality of first flow-channel front ports 11. Moreover, in the embodiment, when the first housing base 10 and the second housing base 20 are matched and assembled with each other, the coolant flow-channel outlet 40 further includes a second buffer chamber 41, which is formed in the second housing base 20 and in fluid communication between the second flow-channel front port 23 of the second flow channel F2 and the coolant flow-channel outlet 40. The second flow-channel front port 23 is extended along the first elongated lateral side L1, and the coolant flow-channel outlet 40 is expanded in communication range through the second buffer chamber 41 and in fluid communication with the second flow-channel front port 23. In case of that the second housing base 20 includes a plurality of second flow channels F2, each one of the second chambers 22 in the second flow channels F2 and each one of the second heat dissipation surfaces 250 are corresponding to one of the second power modules 52, and the plurality of second flow-channel front ports 23 of the second flow channel F2 are connected in parallel through the second buffer chamber 41, and communicate to the coolant flow-channel outlet 40. Since the plurality of second flow-channel front ports 23 are disposed and arranged along the first elongated lateral side L1, it allows the coolant flow-channel outlet 40 to expand in communication range through the second buffer chamber 31 and be in fluid communication with the plurality of second flow-channel front ports 23. In this way, the plural pair of the first channel F1 and the second channel F2 connected in series can be further connected in parallel between the coolant flow-channel inlet 30 and the coolant flow-channel outlet 40, and it facilitates to perform high-efficiency heat dissipation through a shorten flow-channel path relative to the two opposite first elongated lateral side L1 and second elongated lateral side L2. In other embodiments, the coolant flow-channel inlet 30 and the coolant flow-channel outlet 40 are disposed on the second housing base 20, and in communicated with the first buffer chamber 31 and the second buffer chamber 41, respectively. The present disclosure is not limited thereto.

In the embodiment, the first housing base 10 further includes a plurality of first covers 15. Each one of the first covers 15 respectively covers a corresponding one of the first chambers 12, so as to form the first flow channel F1. Moreover, each one of the first covers 15 has an outer surface forming the first dissipation surface 150. Preferably but not exclusively, each one of the first covers 15 further has an inner surface with a plurality of first heat dissipation fins 16, which are accommodated within the corresponding one of the first chambers 12, so that a plurality of micro channels are formed in the first flow channel F1 to increase heat dissipation performance. In other embodiments, the first heat dissipation fins 16 are omitted, and the present disclosure is not limited thereto. Furthermore, in the embodiment, the first housing base 10 further includes a first gasket 14 disposed around an outer periphery of the first chamber 12. The first cover 15 covers the first chamber 12 through the first gasket 14, so that the first cover 15 is firmly and closely combined with the first housing base 10 to form the first flow channel F1. Preferably but not exclusively, in the embodiment, the first cover 15 is fixed on the lower surface 101 of the first housing base 10 through a first fastening component 17. Namely, the first cover 15 is fixed on the lower surface S1 of the elongated housing 2 through the first fastening component 17. Certainly, the types of the first flow channels F1 of the present disclosure is not limited thereto. Similarly, in the embodiment, the second housing base 20 further includes a plurality of second covers 25. Each one of the second covers 25 respectively covers a corresponding one of the second chambers 22, so as to form the second flow channel F2. Moreover, each one of the second covers 25 has an outer surface forming the second dissipation surface 250. In the embodiment, each one of the second covers 25 further has an inner surface with a plurality of second heat dissipation fins 26, which are accommodated within the corresponding one of the second chambers 22, so that a plurality of micro channels are formed in the second flow channel F2 to increase heat dissipation performance. In other embodiments, the second heat dissipation fins 26 are omitted, and the present disclosure is not limited thereto. Furthermore, in the embodiment, the second housing base 20 further includes a second gasket 24 disposed around an outer periphery of the second chamber 22. The second cover 25 covers the second chamber 22 through the second gasket 24, so that the second cover 25 is firmly and closely combined with the second housing base 20 to form the second flow channel F2. Preferably but not exclusively, in the embodiment, the second cover 25 is fixed on the upper surface 202 of the second housing base 20 through a second fastening component 27. Namely, the second cover 25 is fixed on the upper surface S2 of the elongated housing 2 through the second fastening component 27. Certainly, the types of the second flow channels F2 of the present disclosure are not limited thereto.

Figure 7A:
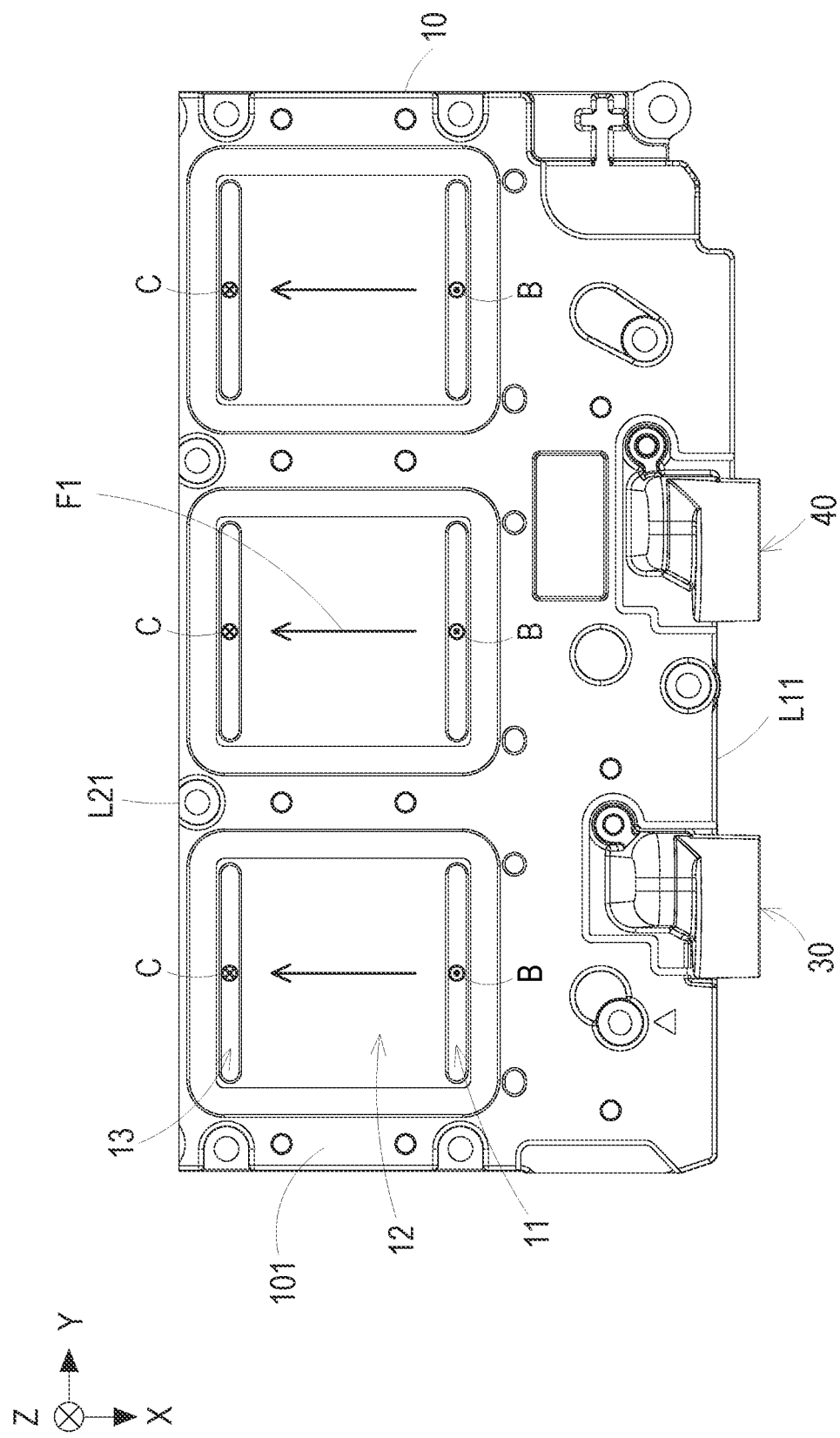
FIG. 7A is a bottom view illustrating the first housing base of the power-module-heat-dissipation assembly according to the first embodiment of the present disclosure and taken from the upper perspective.
Figure 7B:
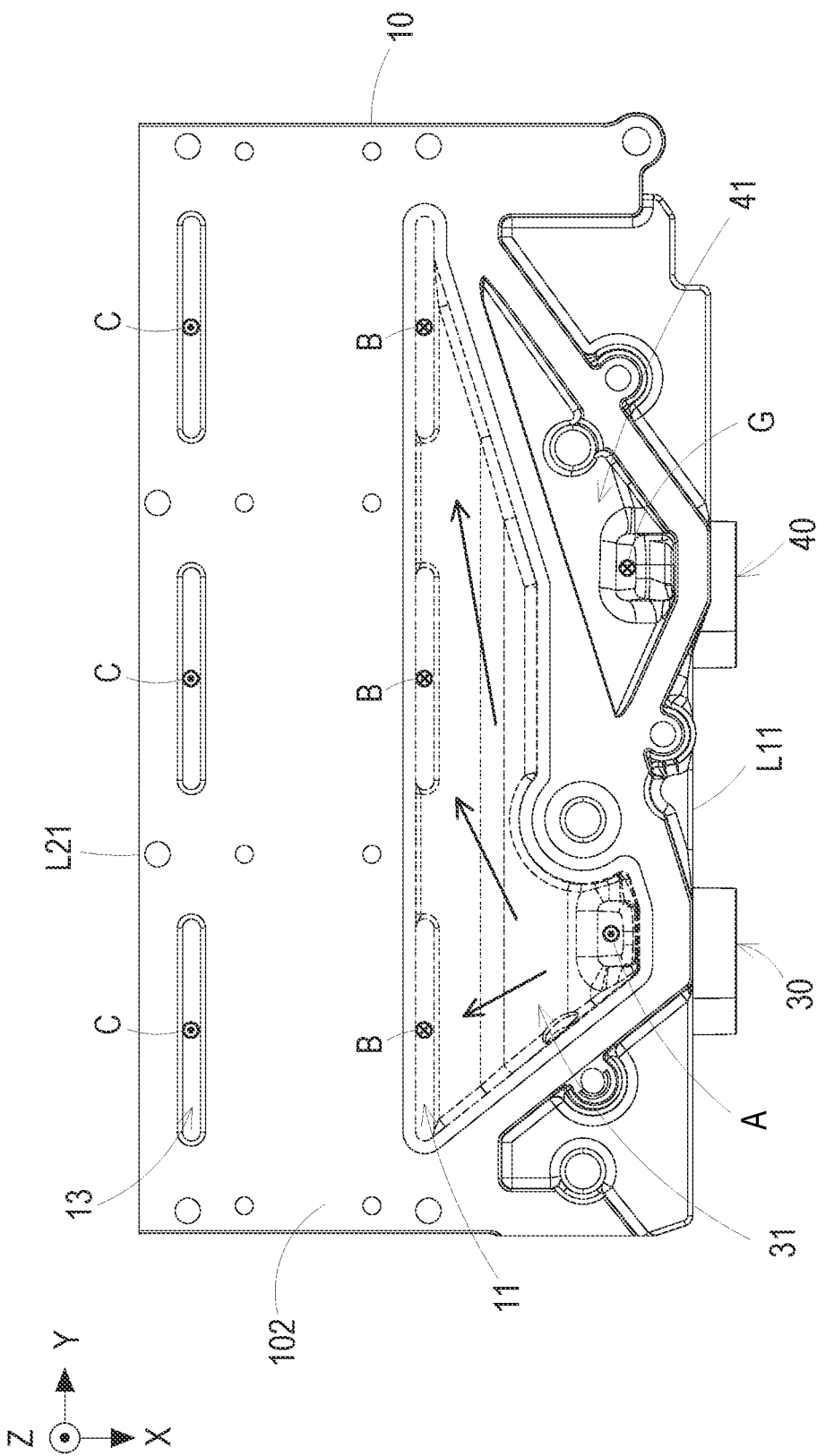
FIG. 7B is a top view illustrating the first housing base of the power-module-heat-dissipation assembly according to the first embodiment of the present disclosure and taken from the upper perspective.
Figure 8A:
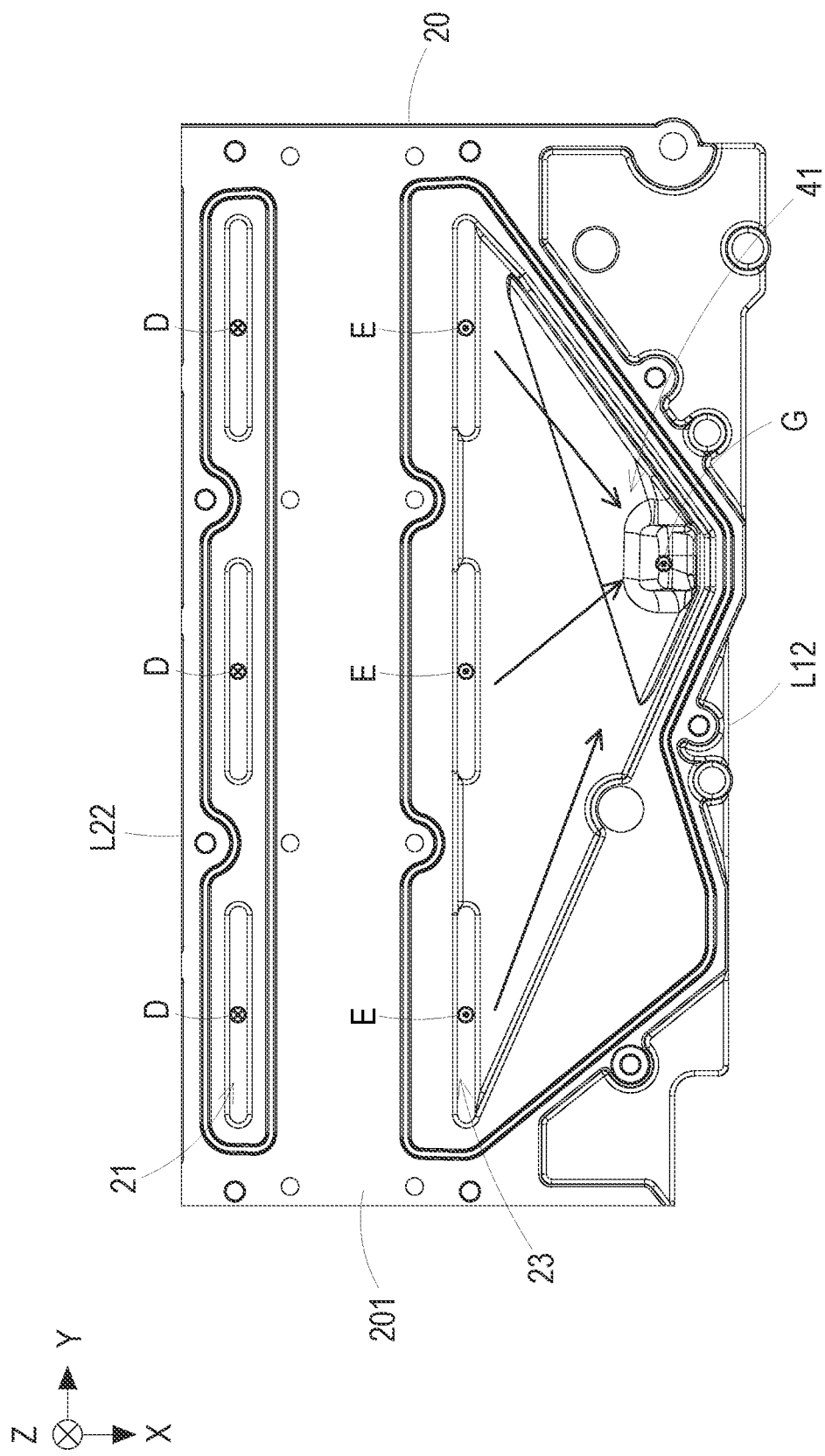
FIG. 8A is a bottom view illustrating the second housing base of the power-module-heat-dissipation assembly according to the first embodiment of the present disclosure and taken from the upper perspective.
Figure 8B:
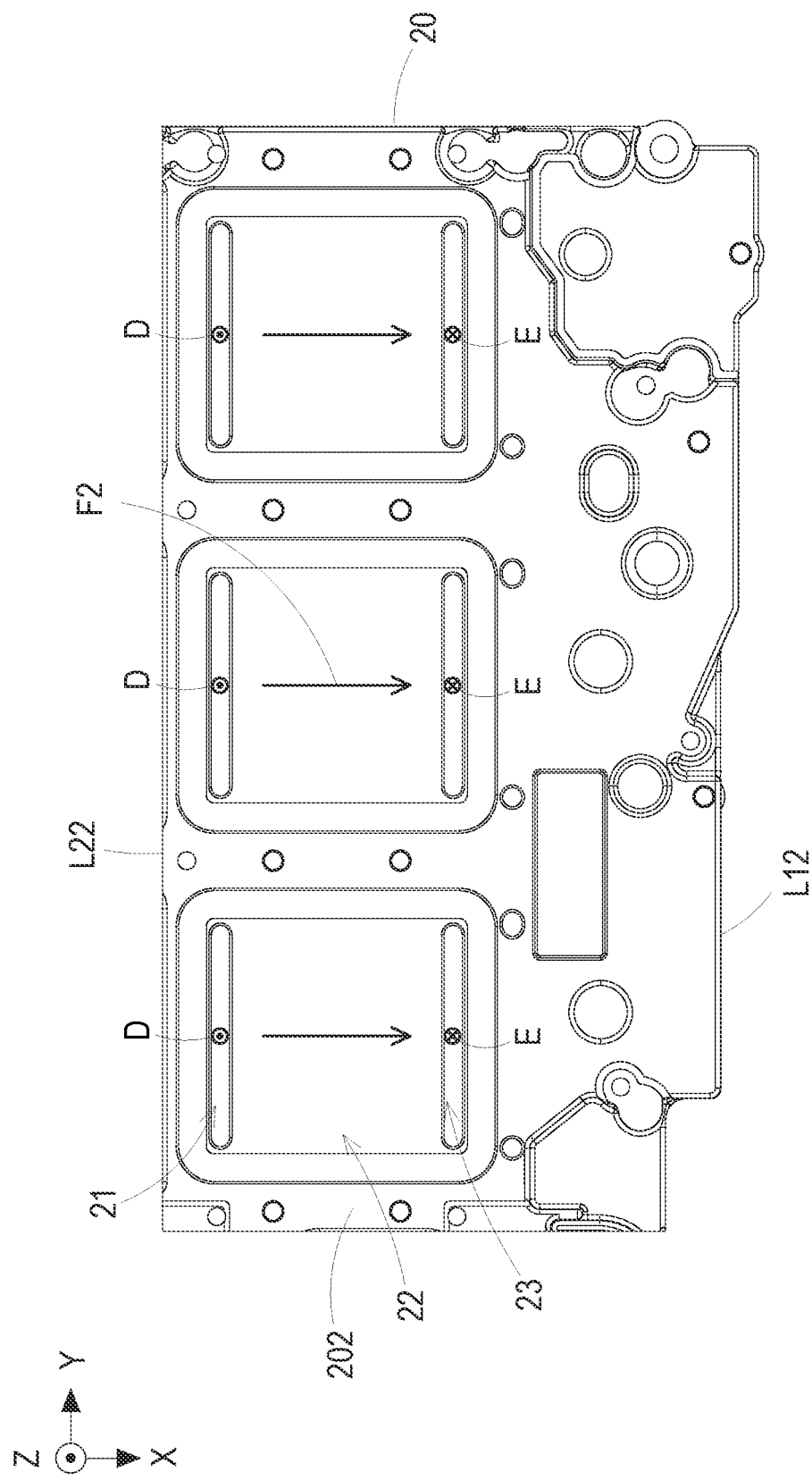
FIG. 8B is a top view illustrating the second housing base of the power-module-heat-dissipation assembly according to the first embodiment of the present disclosure and taken from the upper perspective.

Please refer to FIGS. 1 to 8B. In the embodiment, the first flow-channel rear port 13 is spatially corresponding to the second flow-channel rear port 21. When the first housing base 10 and the second housing base 20 are matched and assembled with each other to form the elongated housing 2, the upper surface 102 of the first housing base 10 is attached to the lower surface 201 of the second housing base 20. In that, the lower surface 101 of the first housing base 10 is served as the lower surface S1 of the elongated housing 2, and the upper surface 202 of the second housing base 20 is served as the upper surface S2 of the elongated housing 2. In the embodiment, the first flow channel F1 and the second flow channel F2 are separately disposed and thermally coupled to the first heat dissipation surface 150 stacked on the lower surface S1 and the second heat dissipation surface 250 stacked on the upper surface S2 of the power-module-heat-dissipation assembly 1, respectively, so as to effectively improve the heat dissipation efficiency of each heat dissipation surface. The coolant (not shown) of the power-module-heat-dissipation assembly 1 is transported from the coolant flow-channel inlet 30 under the first housing base 10 and flows into the first buffer chamber 31 through the point A. Then, the coolant flows through the point B in the first flow-channel front port 11 and enters into the first chamber 12 of the first flow channel F1, so that the heat generated from the first power module 51 of the stacked inverter is taken away through the first heat dissipation surface 150. Afterwards, the coolant is further transported from the point C in the first flow-channel rear port 13 of the first housing base 10, and flows to the point D in the second flow-channel rear port 21 of the second flow-channel rear port 21. Then, the coolant flows through the second flow-channel rear port 21 from the point D and enters the second chamber 22 of the second flow channel F2, so that the heat generated from the second power module 52 of the stacked inverter is taken away through the second heat dissipation surface 250. Finally, the coolant is transported from the point E in the second flow-channel front port 23 of the second housing base 20 to the second buffer chamber 41, flows through the point G, and then is discharged from the coolant flow-channel outlet 40 of the first housing base 10. In the embodiment, with the setting of the first buffer chamber 31 and the second buffer chamber 41, three pairs of the first flow channels F1 and the second flow channels F2 separately disposed and connected in series are further connected in parallel between the coolant flow-channel inlet 30 and the coolant flow-channel outlet 40, so that the coolant can evenly and stably flow through each pair of the first flow channel F1 and the second flow channel F2 connected in series. In other embodiments, the three first flow channels F1 or the three second flow channels F2 are integrally formed into a single first flow channel F1 or a single second flow channel F2 in fluid communication between the first elongated lateral side L1 and the second elongated lateral side L2. It also facilitates to achieve the high-efficiency heat dissipation with a shorten flow-channel path. Moreover, it prevents the heat dissipation performance from being affected due to the formation of an elongated flow channel. Certainly, the present disclosure is not limited thereto.

Figure 9:
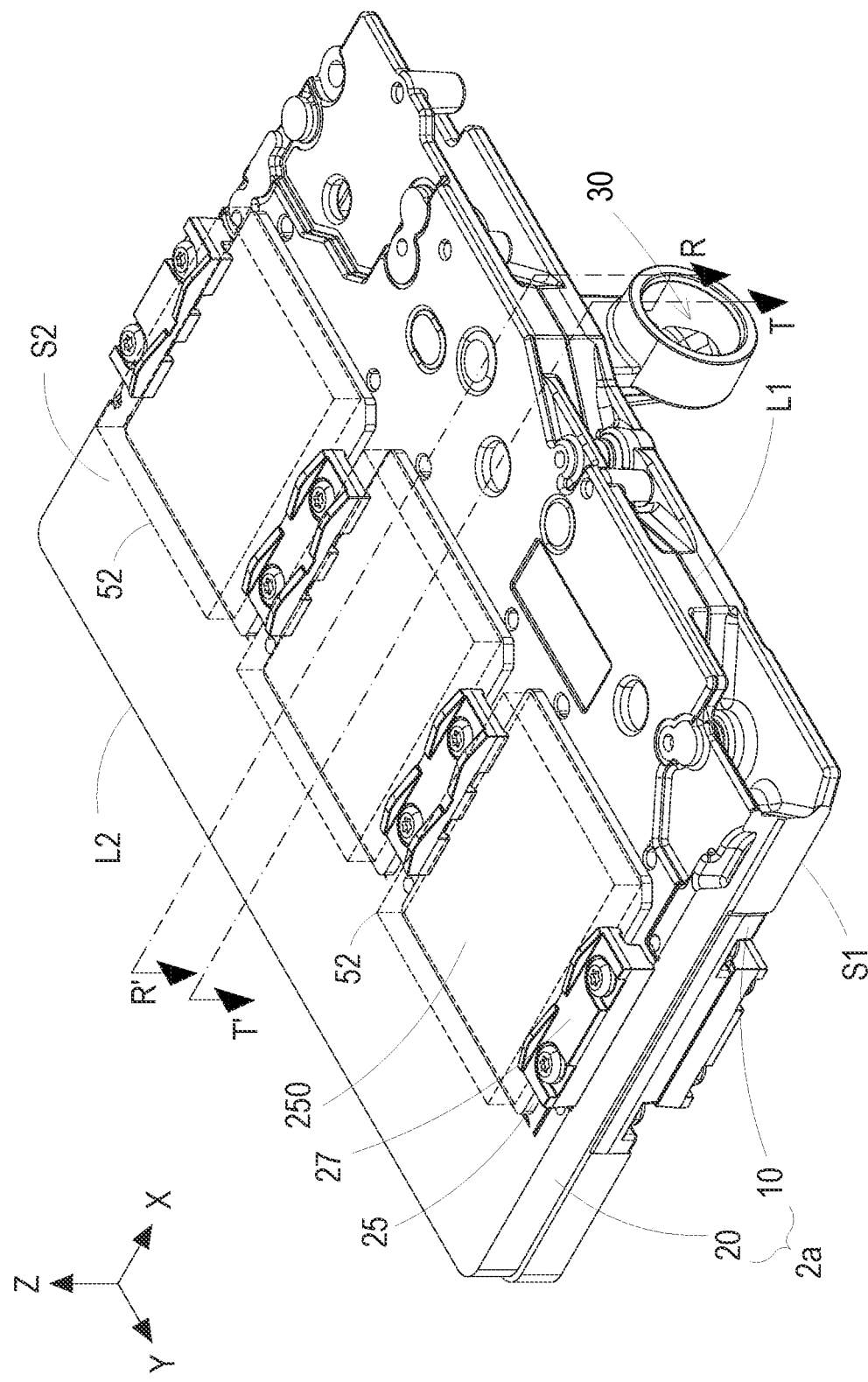
FIG. 9 is a perspective structural view illustrating a power-module-heat-dissipation assembly according to a second embodiment of the present disclosure and taken from the upper perspective.
Figure 10:
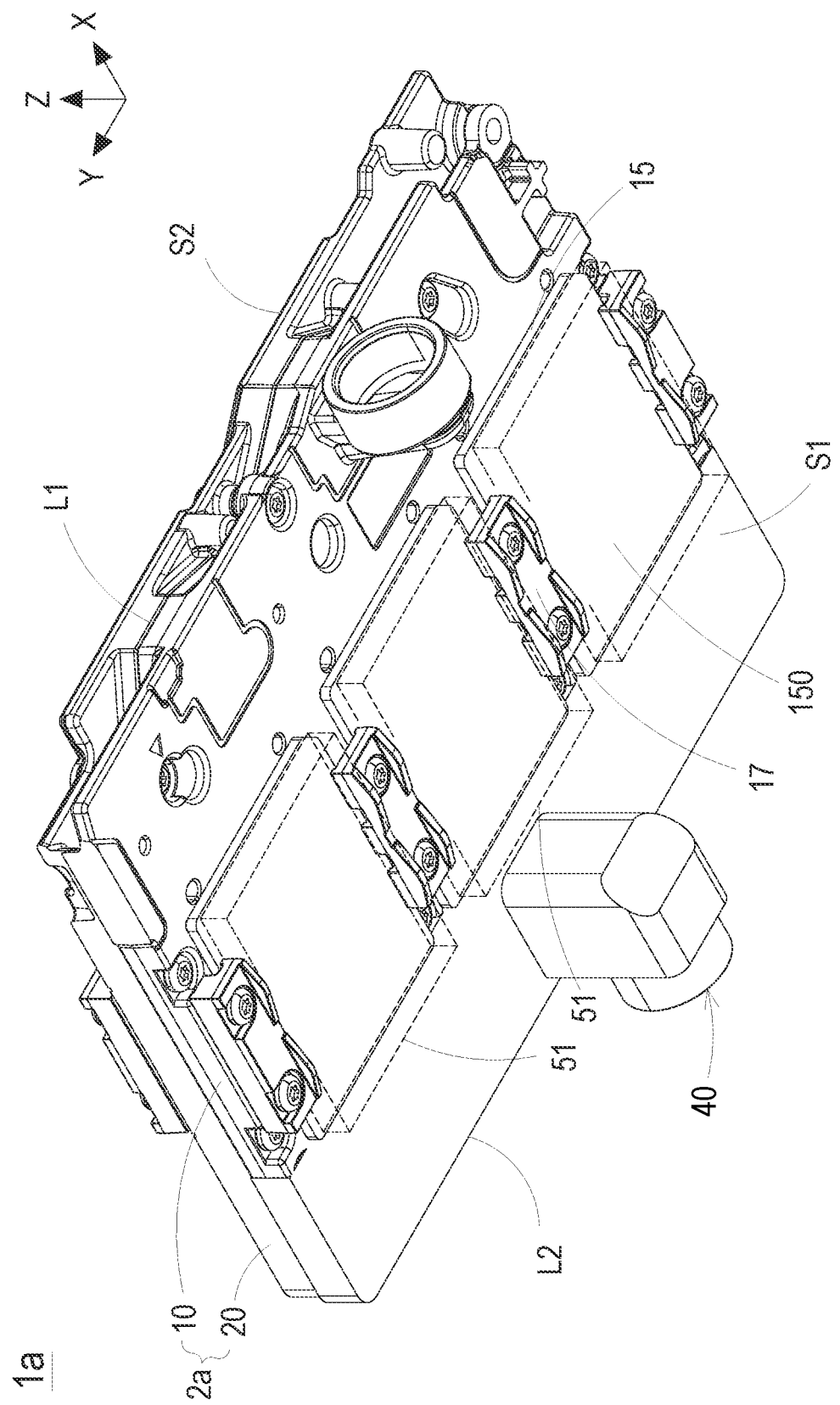
FIG. 10 is a perspective structural view illustrating the power-module-heat-dissipation assembly according to the second embodiment of the present disclosure and taken from the lower perspective.
Figure 11:
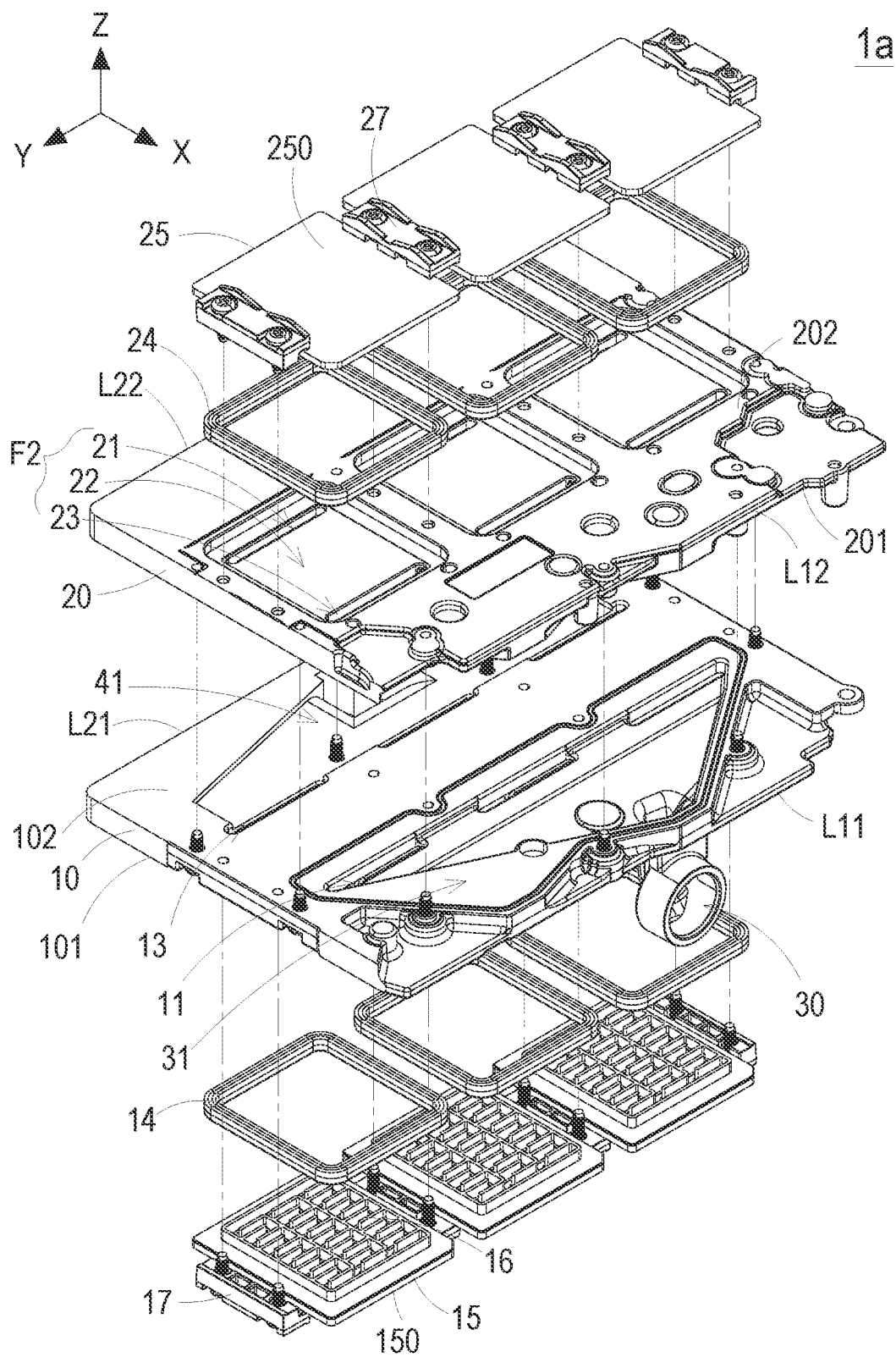
FIG. 11 is an exploded view illustrating the power-module-heat-dissipation assembly according to the second embodiment of the present disclosure and taken from the upper perspective.
Figure 12:
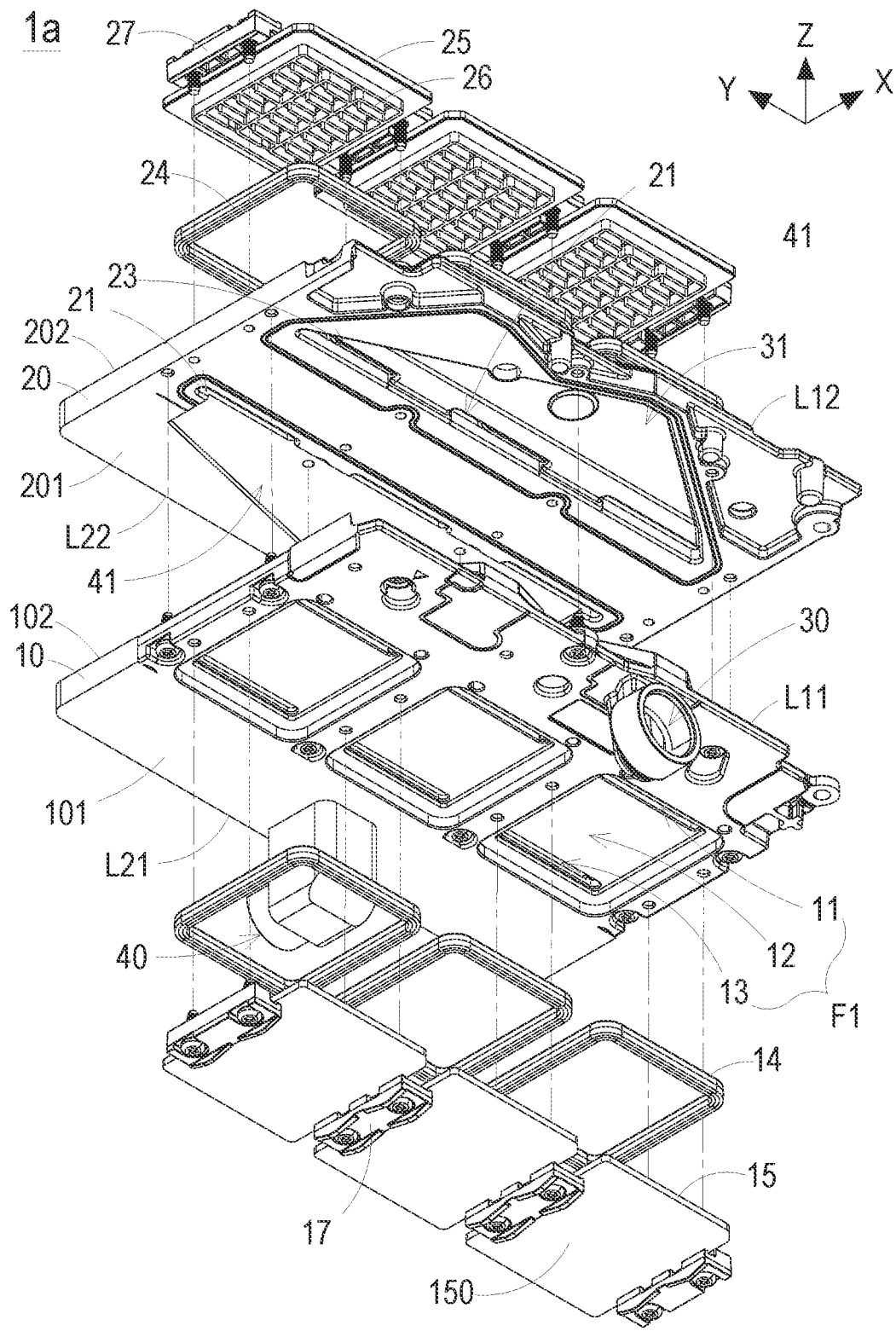
FIG. 12 is an exploded view illustrating the power-module-heat-dissipation assembly according to the second embodiment of the present disclosure and taken from the lower perspective.
Figure 13:
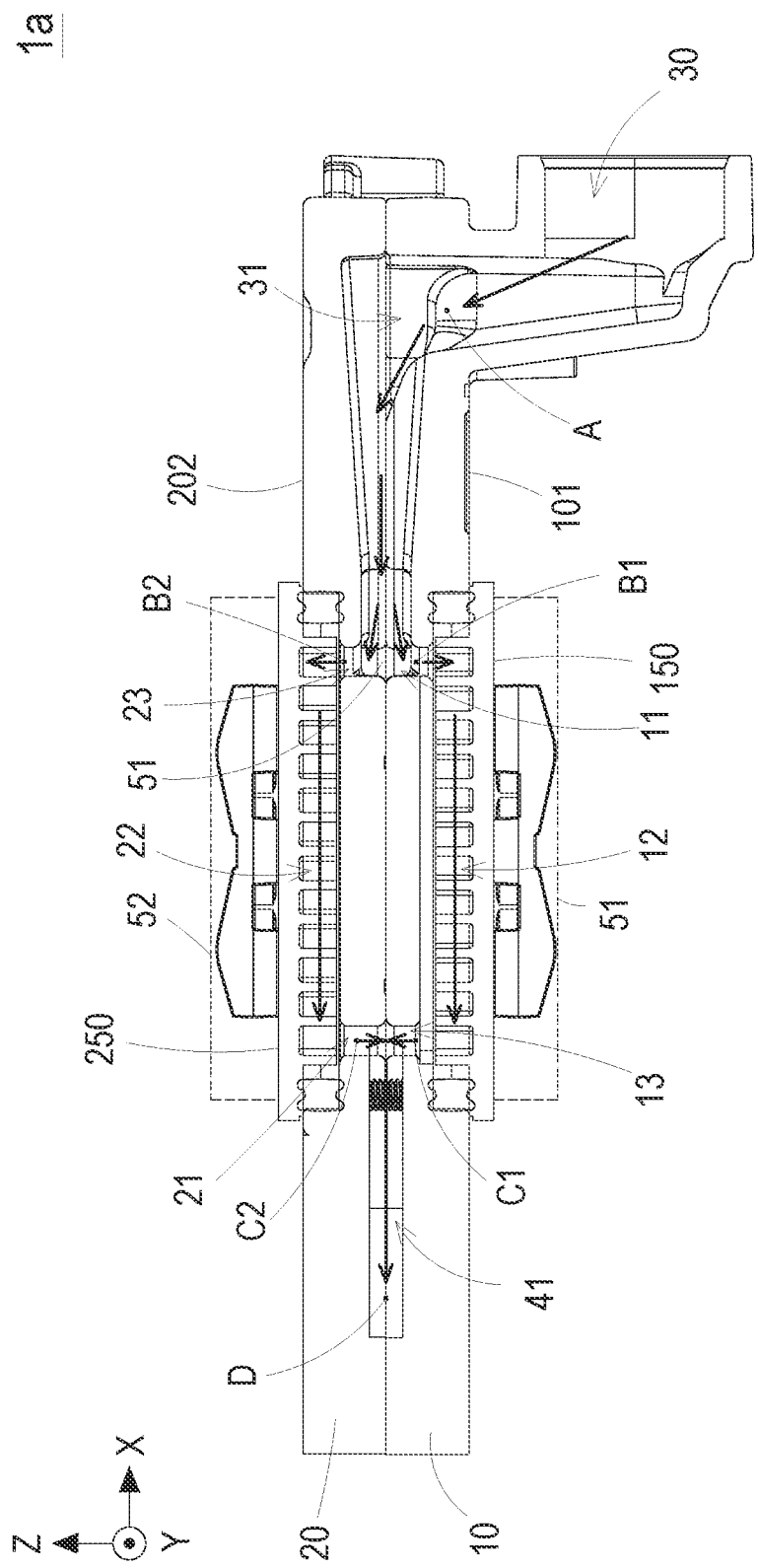
FIG. 13 is a cross-section view of the power-module-heat-dissipation assembly in FIG. 9 taken along the line RR'.
Figure 14:
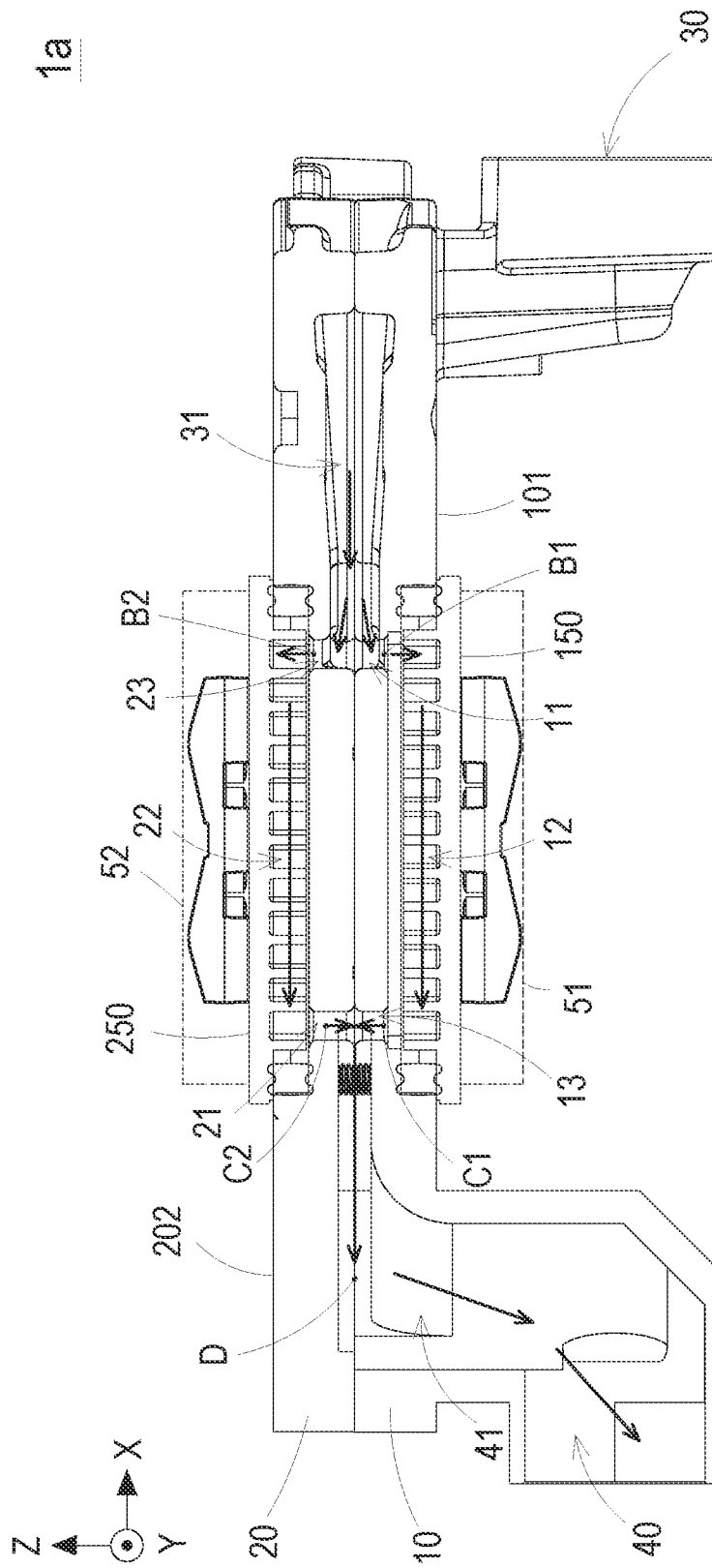
FIG. 14 is a cross-section view of the power-module-heat-dissipation assembly in FIG. 9 taken along the line TT'.

Please refer to FIGS. 9 to 14. In the embodiment, the structures, elements and functions of the power-module-heat-dissipation assembly 1a are similar to those of the power-module-heat-dissipation assembly 1 of FIGS. 1 to 6, and are not redundantly described herein. In the embodiment, when the first housing base 10 and the second housing base 20 are matched and assembled to form the elongated housing 2a, the upper surface 102 of the first housing base 10 is attached to the lower surface 201 of the second housing base 20. The lower surface 101 of the first housing base 10 is served as the lower surface S1 of the elongated housing 2a, and the upper surface 202 of the second housing base 20 is served as the upper surface S2 of the elongated housing 2a. In the embodiment, the first flow-channel front port 11 and the second flow-channel front port 23 are spatially corresponding to each other and in fluid communication. In the embodiment, the coolant flow-channel inlet 30 and the coolant flow-channel outlet 40 are arranged opposite to each other and disposed adjacent to the first elongated lateral side L1 and the second elongated lateral side L2, respectively. In the embodiment, when the upper surface 102 of the first housing base 10 and the lower surface 201 of the second housing base 20 are matched and connected to each other, a first buffer chamber 31 and a second buffer chamber 41 are further formed in the elongated housing 2a. In the embodiment, the first buffer chamber 31 is disposed adjacent to the first elongated lateral side L1, and in fluid communication among the coolant flow-channel inlet 30, the first flow-channel front port 11 and the second flow-channel front port 23. The second buffer chamber 41 is disposed adjacent to the second elongated lateral side L2, and in fluid communication among the first flow-channel rear port 13, the second flow-channel rear port 21 and the coolant flow-channel outlet 40. Different from the serial connection of the first flow channel F1 and the second flow channel F2 in the housing 2, in the embodiment, the first flow channel F1 and the second flow channel F2 are connected in parallel and in fluid communication. The first flow-channel front port 11 and the second flow-channel front port 23 are in fluid communication with the coolant flow-channel inlet 30 through the first buffer chamber 21. The first flow-channel rear port 13 and the second flow-channel rear port 21 are in fluid communication with the coolant flow-channel outlet 40 through the second buffer chamber 41. In this way, the first flow channel F1 and the second flow channel F2 are connected in parallel and in fluid communication between the coolant flow-channel inlet 30 and the coolant flow-channel outlet 40, the first flow channel F1 and the second flow channel F2 can be laterally connected between the two opposite first elongated lateral side L1 and second elongated lateral side L2 of the elongated housing 2a, so as to achieve the purposes of reducing the length of the flow channel and improving the heat dissipation performance. In case of that the power-module-heat-dissipation assembly 1a is applied to the stacked inverter, the coolant inlet direction is perpendicular to the arrangement direction (i.e., the Y axial direction) of the first power modules 51, so that the adjacent ones of the first power modules 51 have the similar condition for heat dissipation conditions. Furthermore, the coolant outlet direction is perpendicular to the arrangement direction (i.e., the Y axial direction) of the second power modules, so that the adjacent ones of the second power modules 52 have the similar condition for heat dissipation. It facilitates each power module to dissipate the heat generated therefrom quickly and evenly, so as to improve the overall efficiency of heat dissipation effectively.

Figure 15B:
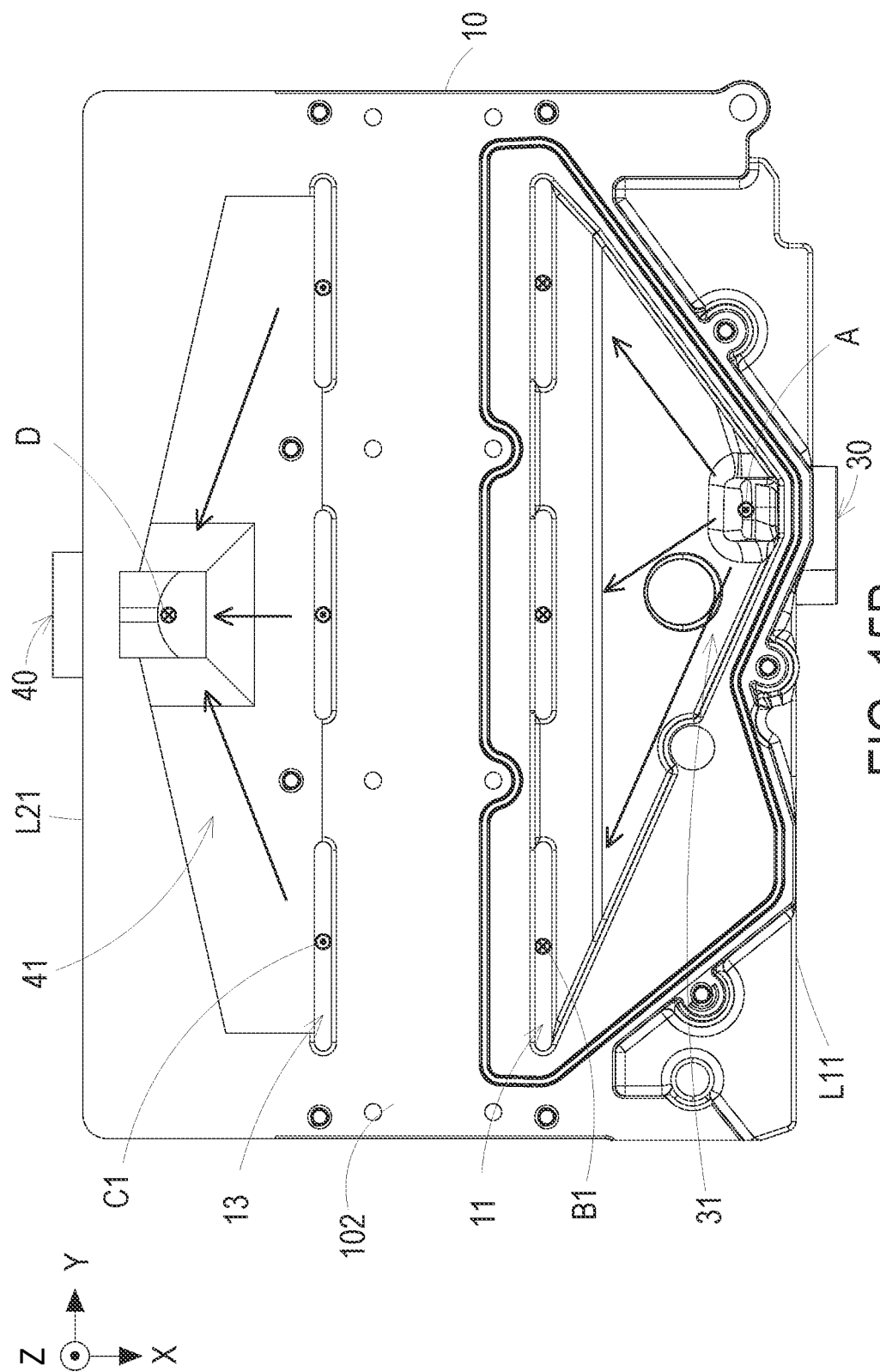
FIG. 15B is a top view illustrating the first housing base of the power-module-heat-dissipation assembly according to the second embodiment of the present disclosure and taken from the upper perspective.
Figure 16B:
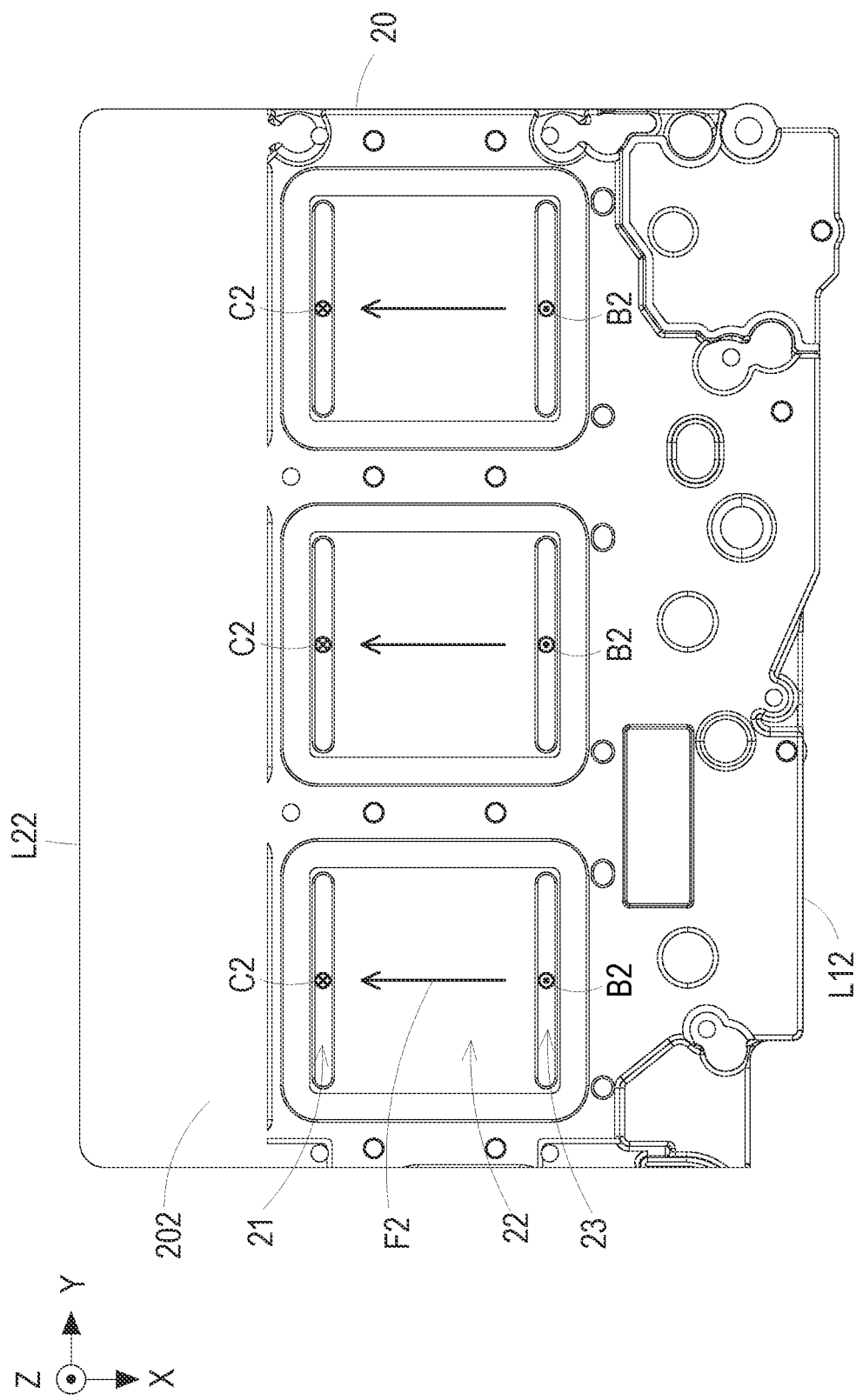
FIG. 16B is a top view illustrating the second housing base of the power-module-heat-dissipation assembly according to the second embodiment of the present disclosure and taken from the upper perspective.

Please refer to FIGS. 9 to 16B. In the embodiment, the first flow-channel front port 11 is spatially corresponding to the second flow-channel front port 23, and the first flow-channel rear port 13 is spatially corresponding to the second flow-channel rear port 21. When the first housing base 10 and the second housing base 20 are matched and assembled with each other to form the elongated housing 2a, the upper surface 102 of the first housing base 10 is attached to the lower surface 201 of the second housing base 20. In that, the lower surface 101 of the first housing base 10 is served as the lower surface S1 of the elongated housing 2a, and the upper surface 202 of the second housing base 20 is served as the upper surface S2 of the elongated housing 2a. In the embodiment, the first flow channel F1 and the second flow channel F2 are stacked between the first heat dissipation surface 150 on the lower surface S1 and the second heat dissipation surface 250 on the upper surface S2, and configured to provide the first heat dissipation surface 150 and the second heat dissipation surface 250 with quick and even heat dissipation performance, respectively. Preferably but not exclusively, the first flow channel F1 and the second flow channel F2 are designed to be connected in parallel and separate flow up and down. For the first power module 51 thermally coupled to the first heat dissipation surface 150, the coolant (not shown) of the power-module-heat-dissipation assembly 1a is transported from the coolant flow-channel inlet 30 under the first housing base 10 and flows into the first buffer chamber 31 through the point A. Then, the coolant flows through the point B1 in the first flow-channel front port 11 and enters into the first chamber 12 of the first flow channel F1, so that the heat generated from the first power module 51 is taken away through the first heat dissipation surface 150. Afterwards, the coolant is further transported from the point C1 in the first flow-channel rear port 13 of the first housing base 10, flows through the point D in the second buffer chamber 41, and then is discharged from the coolant flow-channel outlet 40 of the first housing base 10. On the other hand, for the second power module 52 thermally coupled to the second heat dissipation surface 250, the coolant of the power-module-heat-dissipation assembly 1a is transported from the coolant flow-channel inlet 30 under the first housing base 10 and flows into the first buffer chamber 31 through the point A. Then, the coolant flows through the point B2 in the second flow-channel front port 23 of the second housing base 20 and enters into the second chamber 22 of the second flow channel F2, so that the heat generated from the second power module 52 is taken away through the second heat dissipation surface 250. Afterwards, the coolant is further transported from the point C2 in the second flow-channel rear port 21 of the second housing base 20, flows through the point D in the second buffer chamber 41, and then is discharged from the coolant flow-channel outlet 40 of the first housing base 10. In the embodiment, the first flow channel F1 and the second flow channel F2 are separately disposed in the first housing base 10 and the second housing base 20, respectively, and connected in parallel between the coolant flow-channel inlet 30 and the coolant flow-channel outlet 40. It facilitates to achieve the high-efficiency heat dissipation with a shorten flow-channel path between the first elongated lateral side L1 and the second elongated lateral side L2. Moreover, the first flow channel F1 and the second flow channel F2 are designed to separate flow up and down, so that the heat dissipation efficiency of the first heat dissipation surface 150 and the second heat dissipation surface 250 are consistent. It facilitates the stacked inverter to provide the plurality of first power modules 51 and the plurality of second power modules 52 with quick and even heat dissipation performance, respectively. Notably, since the first buffer chamber 31 is disposed adjacent to the first elongated lateral side L1, the coolant introduced through the coolant flow-channel inlet 30 can be transported into to each one of the first flow-channel front ports 11 and the second flow-channel front ports 23 evenly and quickly. Moreover, since the second buffer chamber 41 is disposed adjacent to the second elongated lateral side L2, the coolant discharged out of each one of the first flow-channel rear ports 13 and the second flow-channel rear ports 21 can converge to the coolant flow-channel outlet 40 quickly. Each one of the first flow channels F1 and the second flow channels F2 of the power-module-heat-dissipation assembly 1a is in fluid communication between the first buffer chamber 31 and the second buffer chamber 32, and corresponding to each one of the first heat dissipation surfaces 150 and the second heat dissipation surfaces 250, so as to achieve the quick and even heat dissipation performance, respectively. In other embodiments, the numbers of the first flow channel F1, the first heat dissipation surfaces 150, the second flow channel F2 and the second heat dissipation surface 250 are adjustable according to the number of the power module in the stacked inverter. The present disclosure is not limited thereto.

Notably, in the embodiment, the coolant flow-channel inlet 30 and the coolant flow-channel outlet 40 are disposed under the first housing base 10. The coolant flow-channel inlet 30 is in fluid communication with the first flow channel F1 and the second flow channel F2 through the first buffer chamber 31, and the coolant flow-channel outlet 40 is in fluid communication with the first flow channel F1 and the second flow channel F2 through the second buffer chamber 41. Comparing FIG. 15A with FIG. 16B or FIG. 15B with FIG. 16A, it can be seen that the first flow channel F1 in the first housing base 10 and the second flow channel F2 in the second housing base 20 are roughly symmetrical. Therefore, it allows to dispose the coolant flow-channel inlet 30 and the coolant flow-channel outlet 40 under the first housing base 10 to be front-back symmetrical. Preferably but not exclusively, in an embodiment, the coolant flow-channel inlet 30 and the coolant flow-channel outlet 40 are disposed over the second housing base 20 to be front-back symmetrical. In another embodiment, the coolant flow-channel inlet 30 and the coolant flow-channel outlet 40 are disposed under the first housing base 10 and over the second housing base 20, respectively. Certainly, the arrangements of the coolant flow-channel inlet 30 and the coolant flow-channel outlet 40 are adjustable according to the practical requirements. Through the functions of the first buffer chamber 31 and the second buffer chamber 41, it facilitates each one of the first flow channels F1 and the second flow channels F2 to achieve the quick and even heat dissipation performance, respectively.

It can be seen from the above that the first flow channel F1 and the second flow channel F2 are separately disposed on the first housing base 10 and the second housing base 20. With the fluid communication of the first buffer chamber 31 and the second chamber 41, the plurality of first flow channels F1 and the plurality of second flow channels F2 are in fluid communication between the first elongated lateral side L1 and the second elongated lateral side L2. It facilitates to achieve the purposes of reducing the length of the flow channel and improving the heat dissipation performance. On the other hand, each one of the first flow channels F1 or the second flow channels F2 is thermally coupled to the corresponding one of the first heat dissipation surfaces 150 and the second heat dissipation surfaces 250, and the plurality of first flow channels F1 and the plurality of second flow channels F2 are in fluid communication between the first elongated lateral side L1 and the second elongated lateral side L2 of the elongated housing 2, 2a. When the power-module-heat-dissipation assembly 1, 1a is applied to a stacked inverter, the first heat dissipation surfaces 150 or the second heat dissipation surfaces 250 thermally coupled to the plurality of power modules can provide each power module with quick and even heat dissipation performance, respectively so as to avoid the accumulation of heat to cause temperature difference or poor heat dissipation performance. It should be noted that when the plurality of power modules are stacked on the lower surface S1 and the upper surface S2 of the elongated housing 2, 2a along the elongated direction, the optimization of the heat dissipation performance can be implemented by adjusting the first flow channels F1 and the second flow channels F2 in fluid communication between the first elongated lateral side L1 and the second elongated lateral side L2. The aforementioned technical features can be combined and adjustable according to the practical requirements. The present disclosure is not limited thereto and not redundantly described hereafter.

In summary, the present disclosure provides a power-module-heat-dissipation assembly suitable for a stacked inverter and capable of providing two separated flow channels for dual elongated power modules stacked on the upper side and the lower side, respectively, so as to improve the heat dissipation efficiency effectively. With coolant flow channels shared and formed between the first power module and the second power module stacked up and down, the coolant flow channels separated in different layers are thermally coupled to two opposite surfaces, respectively, and in fluid communication with each other adjacent to the elongated lateral sides, so that it facilitates the power-module-heat-dissipation assembly to provide an effective efficiency of heat dissipation for the elongated power modules stacked on the upper side and the lower side. The elongated housing includes a first housing base and a second housing base stacked with each other to form a first cooling region and a second cooling region stacked up and down, so as to reduce the unfolded plane. The first flow channel in the first housing base and the second flow channel in the second housing base are located separately and in fluid communication with each other. In order to achieve the purposes of reducing the length of the flow channels and improving the heat dissipation performance, the flow directions of the first flow channel and the second flow channel are designed not to extend along the elongated direction, but a design with shorten path is adopted. Furthermore, the first flow channel and the second flow channel are stacked up and down to reduce the unfolded plane, and the first flow channel and the second flow channel are in fluid communication with each other between two opposite elongated lateral sides of the elongated housing. In this way, the coolant inlet direction is perpendicular to the arrangement direction of the first power modules, so that the adjacent ones of the first power modules have the similar condition for heat dissipation. Furthermore, the coolant outlet direction is perpendicular to the arrangement direction of the second power modules, so that the adjacent ones of the second power module have the similar condition for heat dissipation. It facilitates each power module to dissipate the heat generated therefrom quickly and evenly, so as to improve the overall efficiency of heat dissipation effectively.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power-module-heat-dissipation assembly comprising:
   a plurality of first power modules arranged along a first direction;
   a plurality of second power modules arranged along the first direction;
   a coolant flow-channel inlet;
   a coolant flow-channel outlet;
   a first housing base comprising a first flow channel and a first heat dissipation surface; and
   a second housing base comprising a second flow channel and a second heat dissipation surface;
   wherein the first housing base and the second housing base are matched and assembled with each other to form a housing extended along the first direction and having a first elongated lateral side and a second elongated lateral side opposite to each other, wherein the first heat dissipation surface and the second heat dissipation surface are disposed on two opposite sides of the housing, respectively, the plurality of first power modules are disposed on the first heat dissipation surface along the first direction, and the plurality of second power modules are disposed on the second heat dissipation surface along the first direction, wherein the first flow channel is a hollow structure of the first housing base and comprises a first flow-channel front port, a first chamber and a first flow-channel rear port, the first chamber is in fluid communication with the first flow-channel front port and the first flow-channel rear port, the first chamber is corresponding to an outer surface of the first housing base to form the first heat dissipation surface, the second flow channel is a hollow structure of the second housing base and comprises a second flow-channel front port, a second chamber and a second flow-channel rear port, the second chamber is in fluid communication with the second flow-channel front port and the second flow-channel rear port, and the second chamber is corresponding to an outer surface of the second housing base to form the second heat dissipation surface, wherein the coolant flow-channel inlet is in fluid communication with the first flow-channel front port, the first flow-channel rear port is in fluid communication with the second flow-channel rear port, and the second flow-channel front port is in fluid communication with the coolant flow-channel outlet,
   wherein the first flow-channel front port and the second flow-channel front port are disposed adjacent to the first elongated lateral side, and the first flow-channel rear port and the second flow-channel rear port are disposed adjacent to the second elongated lateral side.

2. The power-module-heat-dissipation assembly according to claim 1, wherein the coolant flow-channel inlet comprises a first buffer chamber, and the first buffer chamber is formed in the first housing base, wherein the first flow-channel front port is extended along the first elongated lateral side, and the coolant flow-channel inlet is expanded in communication range through the first buffer chamber and in fluid communication with the first flow-channel front port.

3. The power-module-heat-dissipation assembly according to claim 1, wherein the coolant flow-channel outlet comprises a second buffer chamber, and the second buffer chamber is formed in the second housing base, wherein the second flow-channel front port is extended along the first elongated lateral side, and the coolant flow-channel outlet is expanded in communication range through the second buffer chamber and in fluid communication with the second flow-channel front port.

4. The power-module-heat-dissipation assembly according to claim 1, wherein the coolant flow-channel inlet comprises a first buffer chamber, and the first buffer chamber is formed in the first housing base, wherein the coolant flow-channel outlet comprises a second buffer chamber, and the second buffer chamber is formed in the second housing base, wherein the first flow channel of the first housing base further comprises a plurality of first flow channels, the first heat dissipation surface comprises a plurality of first heat dissipation surfaces, and each one of the first chambers in the corresponding one of the first flow channels and each one of the first heat dissipation surfaces are corresponding to one of the first power modules, wherein the second flow channel of the second housing base further comprises a plurality of second flow channels, the second heat dissipation surface comprises a plurality of second heat dissipation surfaces, and each one of the second chambers in the corresponding one of the second flow channels and each one of the second heat dissipation surfaces are corresponding to one of the second power modules, wherein the first flow-channel front ports of the plurality of first flow channels are disposed and extended along the first elongated lateral side, and the coolant flow-channel inlet is expanded in communication range through the first buffer chamber and in fluid communication with the first flow-channel front ports, wherein the second flow-channel front ports of the plurality of second flow channels are disposed and extended along the first elongated lateral side, and the coolant flow-channel outlet is expanded in communication range through the second buffer chamber and in fluid communication with the second flow-channel front ports.

5. The power-module-heat-dissipation assembly according to claim 4, wherein the first housing base further comprises a plurality of first covers respectively covering a corresponding one of the first chambers, each one of the first covers has an outer surface forming the first heat dissipation surface and an inner surface with a plurality of first heat dissipation fins accommodated within the corresponding one of the first chambers, wherein the second housing base further comprises a plurality of second covers respectively covering corresponding one of the second chambers, each one of the second covers has an outer surface forming the second heat dissipation surface and an inner surface with a plurality of second heat dissipation fins accommodated within the corresponding one of the second chambers, wherein the first housing base further comprises a first gasket disposed around an outer periphery of the first chamber, and the first cover covers the first chamber through the first gasket, and the second housing base further comprises a second gasket disposed around an outer periphery of the second chamber, and the second cover covers the second chamber through the second gasket.

6. The power-module-heat-dissipation assembly according to claim 4, wherein the first housing base and the second housing base are matched and assembled with each other to form the first buffer chamber, wherein the first housing base and the second housing base are matched and assembled with each other to form the second buffer chamber.

7. The power-module-heat-dissipation assembly according to claim 1, wherein the first housing base further comprises a first covers correspondingly covering the first chamber, the first cover has an outer surface forming the first heat dissipation surface and an inner surface with a plurality of first heat dissipation fins accommodated within the first chamber, wherein the second housing base further comprises a second cover correspondingly covering the second chamber, the second cover has an outer surface forming the second heat dissipation surface and an inner surface with a plurality of second heat dissipation fins accommodated within the second chamber, wherein the first housing base further comprises a first gasket disposed around an outer periphery of the first chamber, and the first cover covers the first chamber through the first gasket, and the second housing base further comprises a second gasket disposed around an outer periphery of the second chamber, and the second cover covers the second chamber through the second gasket.

8. The power-module-heat-dissipation assembly according to claim 1, wherein the plurality of first power modules and the plurality of second power modules form two sets of multi-phase inverters, and output two sets of motor driving currents.

9. The power-module-heat-dissipation assembly according to claim 1, wherein the plurality of first power modules are paired with the plurality of second power modules to form a parallel multi-phase inverter, the plurality of first power modules and the plurality of second power modules correspond up and down and output in parallel, and the plurality of first power modules and the plurality of second power modules are connected in parallel to output a set of motor drive currents.

10. A power-module-heat-dissipation assembly comprising:
a plurality of first power modules arranged along a first direction;
a plurality of second power modules arranged along the first direction;
a coolant flow-channel inlet;
a coolant flow-channel outlet;
a first housing base comprising a first flow channel and a first heat dissipation surface; and
a second housing base comprising a second flow channel and a second heat dissipation surface;
wherein the first housing base and the second housing base are matched and assembled with each other to form a housing extended along the first direction and having a first elongated lateral side and a second elongated lateral side opposite to each other, wherein the first heat dissipation surface and the second heat dissipation surface are disposed on two opposite sides of the housing, respectively, the plurality of first power modules are disposed on the first heat dissipation surface along the first direction, and the plurality of second power modules are disposed on the second heat dissipation surface along the first direction, wherein the first flow channel is a hollow structure of the first housing base and comprises a first flow-channel front port, a first chamber and a first flow-channel rear port, the first chamber is in fluid communication with the first flow-channel front port and the first flow-channel rear port, the first chamber is corresponding to an outer surface of the first housing base to form the first heat dissipation surface, the second flow channel is a hollow structure of the second housing base and comprises a second flow-channel front port, a second chamber and a second flow-channel rear port, the second chamber is in fluid communication with the second flow-channel front port and the second flow-channel rear port, and the second chamber is corresponding to an outer surface of the second housing base to form the second heat dissipation surface, wherein the coolant flow-channel inlet is in fluid communication with the first flow-channel front port and the second flow-channel front port, and the first flow-channel rear port and the second flow-channel rear port are in fluid communication with the coolant flow-channel outlet,
wherein the first flow-channel front port and the second flow-channel front port are disposed adjacent to the first elongated lateral side, and the first flow-channel rear port and the second flow-channel rear port are disposed adjacent to the second elongated lateral side,
wherein the coolant flow-channel inlet comprises a first buffer chamber, and the first buffer chamber is formed in the first housing base, wherein the coolant flow-channel outlet comprises a second buffer chamber, and the second buffer chamber is formed in the second housing base, wherein the first flow-channel of the first housing base further comprises a plurality of first flow channels, the first heat dissipation surface comprises a plurality of the first dissipation surfaces, and each one of the first chambers in the corresponding one of the first flow channels and each one of the first heat dissipation surfaces are corresponding to one of the first power modules, wherein the second flow channel of the second housing base further comprises a plurality of second flow channels, the second heat dissipation surface comprises a plurality of second heat dissipation surfaces, and each one of the second chambers in the corresponding one of the second flow channels and each one of the second heat dissipation surfaces are corresponding to one of the second power modules, wherein a plurality of the first flow-channel front ports of the plurality of first flow channels and the second flow-channel front ports of the plurality of second flow channels are disposed and extended along the first elongated lateral side, and the coolant flow-channel inlet is expanded in communication range through the first buffer chamber and in fluid communication with the first flow-channel front parts and the second flow-channel front port, wherein the first flow-channel rear ports of the plurality of first flow channels and the second flow-channel rear ports of the plurality of second flow channels are disposed and extended along the first elongated lateral side, and the coolant flow-channel outlet is expanded in communication range through the second buffer chamber and in fluid communication with the first flow-channel rear ports and the second flow-channel near ports.

11. The power-module-heat-dissipation assembly according to claim 10, wherein the coolant flow-channel inlet comprises a first buffer chamber, and the first buffer chamber is formed in the first housing base, wherein the first flow-channel front port is extended along the first elongated lateral side, and the coolant flow-channel inlet is expanded in communication range through the first buffer chamber and in fluid communication with the first flow-channel front port and the second flow-channel front port.

12. The power-module-heat-dissipation assembly according to claim 10, wherein the coolant flow-channel outlet comprises a second buffer chamber, and the second buffer chamber is formed in the second housing base, wherein the second flow-channel front port is extended along the first elongated lateral side, and the coolant flow-channel outlet is expanded in communication range through the second buffer chamber and in fluid communication with the first flow-channel rear port and the second flow-channel rear port.

13. The power-module-heat-dissipation assembly according to claim 10, wherein the first housing base further comprises a plurality of first covers respectively covering corresponding one of the first chambers, each one of the first covers has an outer surface forming the first heat dissipation surface and an inner surface with a plurality of first heat dissipation fins accommodated within the corresponding one of the first chambers, wherein the second housing base further comprises a plurality of second covers respectively covering corresponding one of the second chambers, each one of the second covers has an outer surface forming the second heat dissipation surface and an inner surface with a plurality of second heat dissipation fins accommodated within the corresponding one of the second chambers, wherein the first housing base further comprises a first gasket disposed around an outer periphery of the first chamber, and the first cover covers the first chamber through the first gasket, and the second housing base further comprises a second gasket disposed around an outer periphery of the second chamber, and the second cover covers the second chamber through the second gasket.

14. The power-module-heat-dissipation assembly according to claim 10, wherein the first housing base and the second housing base are matched and assembled with each other to form the first buffer chamber, wherein the first housing base and the second housing base are matched and assembled with each other to form the second buffer chamber.

15. The power-module-heat-dissipation assembly according to claim 10, wherein the first housing base further comprises a first covers correspondingly covering the first chamber, the first cover has an outer surface forming the first heat dissipation surface and an inner surface with a plurality of first heat dissipation fins accommodated within the first chamber, wherein the second housing base further comprises a second cover correspondingly covering the second chamber, the second cover has an outer surface forming the second heat dissipation surface and an inner surface with a plurality of second heat dissipation fins accommodated within the second chamber, wherein the first housing base further comprises a first gasket disposed around an outer periphery of the first chamber, and the first cover covers the first chamber through the first gasket, and the second housing base further comprises a second gasket disposed around an outer periphery of the second chamber, and the second cover covers the second chamber through the second gasket.

16. The power-module-heat-dissipation assembly according to claim 10, wherein the plurality of first power modules and the plurality of second power modules form two sets of multi-phase inverters, and output two sets of motor driving currents.

17. The power-module-heat-dissipation assembly according to claim 10, wherein the plurality of first power modules are paired with the plurality of second power modules to form a parallel multi-phase inverter, the plurality of first power modules and the plurality of second power modules correspond up and down and output in parallel, and the plurality of first power modules and the plurality of second power modules are connected in parallel to output a set of motor drive currents.

* * * * *